United States Patent

Abe et al.

[11] Patent Number: 6,010,826
[45] Date of Patent: Jan. 4, 2000

[54] RESIST COMPOSITION

[75] Inventors: Nobunori Abe, Kanagawa; Shugo Matsuno; Hideyuki Tanaka, both of Tokyo; Tatsuya Sugimoto; Yasumasa Wada, both of Kanagawa, all of Japan

[73] Assignee: Nippon Zeon Co., Ltd., Tokyo, Japan

[21] Appl. No.: 08/817,358

[22] PCT Filed: Oct. 13, 1995

[86] PCT No.: PCT/JP95/02114

§ 371 Date: Apr. 11, 1997

§ 102(e) Date: Apr. 11, 1997

[87] PCT Pub. No.: WO96/12216

PCT Pub. Date: Apr. 25, 1996

[30] Foreign Application Priority Data

Oct. 13, 1994 [JP] Japan .................................. 6-274457
Jan. 13, 1995 [JP] Japan .................................. 7-021250
Mar. 16, 1995 [JP] Japan .................................. 7-084729

[51] Int. Cl.⁷ .............................. G03F 7/039; G03F 7/004
[52] U.S. Cl. .................................. 430/285.1; 430/286.1; 430/287.1; 430/288.1; 430/281.1
[58] Field of Search .............................. 430/286.1, 287.1, 430/288.1, 285.1, 281.1

[56] References Cited

U.S. PATENT DOCUMENTS

| | | | |
|---|---|---|---|
| 3,556,793 | 1/1971 | Field et al. | 430/287.1 |
| 3,779,778 | 12/1973 | Smith et al. | 96/115 R |
| 4,248,957 | 2/1981 | Sander et al. | 430/270.1 |
| 4,311,782 | 1/1982 | Buhr et al. | 430/270.1 |
| 4,318,976 | 3/1982 | Shu et al. | 430/287.1 |
| 4,491,628 | 1/1985 | Ito et al. | 430/176 |
| 4,581,401 | 4/1986 | Asmussen et al. | 524/302 |
| 4,804,612 | 2/1989 | Asaumi et al. | 430/192 |
| 5,070,001 | 12/1991 | Stahlhofen | 430/281.1 |
| 5,153,095 | 10/1992 | Kawamura et al. | 430/175 |

FOREIGN PATENT DOCUMENTS

| | | |
|---|---|---|
| 0264908 | 4/1988 | European Pat. Off. . |
| 0266654 | 5/1988 | European Pat. Off. . |
| 0534324 | 3/1993 | European Pat. Off. . |
| 0541112 | 5/1993 | European Pat. Off. . |
| 4410441 | 9/1994 | Germany . |
| 48-89003 | 11/1973 | Japan . |
| 55-12995 | 1/1980 | Japan . |
| 56-17345 | 2/1981 | Japan . |
| 2-27660 | 3/1984 | Japan . |
| 63-25646 | 2/1988 | Japan . |
| 5-019139 | 6/1988 | Japan . |
| 3-150567 | 6/1991 | Japan . |
| 4-158363 | 6/1992 | Japan . |
| 4-246651 | 9/1992 | Japan . |
| 4-269754 | 9/1992 | Japan . |
| 5-249673 | 9/1993 | Japan . |
| 5-249677 | 9/1993 | Japan . |
| 5-323612 | 12/1993 | Japan . |
| 6-3823 | 1/1994 | Japan . |

OTHER PUBLICATIONS

Derwent WPI Abstract No. XP–002064830, AN 93–185601 of Japanese Reference No. 5–113667 dated May 7, 1993.

Padwa et al, Chemical Abstracts, 100:67606 of J. Org Chem (1984), 49(3), 399–406.

*Primary Examiner*—Cynthia Hamilton
*Attorney, Agent, or Firm*—Dinsmore & Shohl LLP

[57] ABSTRACT

The invention provides a resist composition comprising a polymer (a) having groups cleavable by an acid and a compound (b) which can form an acid upon exposure to active rays, wherein the polymer (a) is a polymer having, as the groups cleavable by an acid, groups containing a substituted allyloxy group having at least two substituents, and a resist composition comprising a resin binder (A), a compound (B) which can form an acid upon exposure to active rays, and a compound (C) having a group cleavable by an acid, wherein the compound (C) having the group cleavable by an acid is a compound having a group containing a substituted allyloxy group having at least one substituent. The resist compositions have excellent sensitivity, resolution and heat resistance and can provide excellent pattern form.

30 Claims, No Drawings

RESIST COMPOSITION

TECHNICAL FIELD

The present invention relates to resist compositions suitable for use in minute processing of semiconductor elements, and more particularly to resist materials permitting formation of patterns by irradiation of far ultraviolet radiation, krypton fluoride laser beam, electron beam or the like.

BACKGROUND ART

Upon fabrication of a semiconductor device, an image is obtained by a lithography technique in which a resist is applied to the surface of a silicon wafer to form a photosensitive film, the film is exposed to light to form a latent image, and the latent image is then developed to form a negative or positive image.

With the advancement of high integration, high density assembly, miniaturization and speedup of semiconductors toward IC, LSI and further VLSI, demands on minute processing of elements are enhanced, and there is a demand for development of techniques forming a minute pattern having a line width of 0.5 μm or less at present. It is however extremely difficult to form such a minute pattern by the conventional lithography technique making use of near ultraviolet radiation or visible radiation. Its yield is also lowered to a significant extent.

Therefore, in order to enhance the resolution of exposure, there are studied other lithography techniques making use of far ultraviolet radiation (short wavelength ultraviolet radiation), krypton fluoride laser (hereinafter referred to as "KrF excimer laser") beam or the like, which is shorter in wavelength than near ultraviolet radiation, instead of the conventional lithography technique utilizing near ultraviolet rays having a wavelength of 350–450 nm.

Novolak resins are widely used as base polymers in the conventional lithography technique utilizing near ultraviolet radiation. However, the novolak resins have been known to involve problems that sufficient sensitivity can not be achieved, and the form of the resulting pattern is deteriorated because they scarcely transmit rays having a short wavelength, such as far ultraviolet radiation and KrF excimer laser.

In recent years, therefore, attention has been attracted to a resist system in which a compound (i.e., a photo-induced acid generator) which generates an acid upon exposure to active rays (i.e., activated radiation) such as light or electron beam is combined with a compound which is decomposed by an acid catalyst to become soluble in a developer with a view toward achieving high sensitivity and high resolution. For example, acetal compounds (Japanese Patent Application Laid-Open No. 89003/1973), enol ether compounds (Japanese Patent Application Laid-Open No. 12995/1980) and the like have been proposed as acid-sensitive compounds used in combination with the photo-induced acid generator. Besides, a resist composition for minute processing, which is composed of a three component system of a base polymer, a photo-induced acid generator and a substance (an acid-sensitive compound) which reacts in the presence of an acid as a catalyst, which has been generated by the exposure to light, to change the solubility and the like of the base polymer, has been developed. It has been proposed to use, as the base polymer (a resin binder), a polymer having an orthoester group in its main chain (Japanese Patent Application Laid-Open No. 17345/1981), a polymer having a tert-butyl ester group of a carboxylic acid or a tert-butyl carbonate group of phenol (Japanese Patent Application Laid-Open No. 27660/1990), or the like. However, these methods are still insufficient from the viewpoints of sensitivity, storage stability, stability with time, resolution, pattern form and the like and hence fail to provide a fully satisfactory resist composition.

It has been proposed to use a hydrogenated polyvinylphenol derivative as a base polymer for the purpose of enhancing transmittance (Japanese Patent Application Laid-Open No. 249673/1993). According to this method, resolution is improved to some extent. In view of a recent higher standard of performance requirements on resists, however, further improvements are requested on resolution, pattern form and resistance to etching in particular.

As more recent examples, it has been proposed to bond a t-butoxycarbonyl group, t-amyloxycarbonyl group, t-butyl group, t-hexyl group, allyl group, 2-cyclohexyl group or the like as a protecting group, which is decomposed by an acid or base, to an alkali-soluble resin (Japanese Patent Application Laid-Open No. 158363/1992) or use a compound having a tert-amyl structure in its molecule (Japanese Patent Application Laid-Open No. 269754/1992) in order to attain higher sensitivity and heat stability. In view of a recent higher standard of performance requirements on resists, however, further improvements are requested on resolution, pattern form and resistance to etching in particular as described above.

It is more important that a resist film formed with any of the above-described resist compositions can not fully meet heat stability at a practical level and has involved a problem that a resist form is deteriorated by heat generated in an etching process upon transferring a resist pattern to a substrate (for example, silicon substrate), resulting in a failure to exactly transfer the resist form to the substrate.

In order to solve this problem, there has been proposed a resist composition in which a group capable of forming a secondary carbonium ion intermediate having a proton usable in a reaction upon cleavage is used as a protecting group to be decomposed by an acid or base in an alkali-soluble resin, thereby improving its heat stability (heat resistance) (Japanese Patent Publication No. 19139/1993). The resist film described in this document is recognized to have improved thermal properties compared with a resist having a t-butyl group as a group unstable to an acid. However, its sensitivity required of a resist film is markedly deteriorated. The resist composition is hence unpractical.

As described above, the sensitivity of resist compositions is improved to a considerable extent by investigating such a protecting group. In view of a recent higher standard of performance requirements on resists, however, further improvements are requested on resolution, heat resistance, form of resist pattern and resistance to etching in particular.

DISCLOSURE OF THE INVENTION

It is an object of the present invention to provide a resist composition by which sensitivity, resolution, heat resistance, pattern form, resistance to etching and the like are markedly improved.

The present inventors have carried out an extensive investigation with a view toward solving the above-described problems. As a result, it has been found that in a resist composition containing a polymer (base polymer or resin binder) having groups cleavable by an acid and a compound (photo-induced acid generator) which can form an acid upon exposure to active rays, a polymer having groups containing a substituted allyloxy group having at least two substituents is used as said polymer, whereby the above object can be achieved.

The present inventors have also found that in a resist composition containing a resin binder, a photo-induced acid generator and a compound having a group cleavable by an acid, a compound having a group containing a substituted allyloxy group having at least one substituent is used as said compound, whereby the above object can be achieved. The present invention has been led to completion based on these findings.

According to the present invention, there is thus provided a resist composition comprising a polymer (a) having groups cleavable by an acid and a compound (b) which can form an acid upon exposure to active rays, wherein the polymer (a) is a polymer having, as the groups cleavable by an acid, groups containing a substituted allyloxy group having at least two substituents.

According to the present invention, there is also provided a resist composition comprising a resin binder (A), a compound (B) which can form an acid upon exposure to active rays, and a compound (C) having a group cleavable by an acid, wherein the compound (C) having the group cleavable by an acid is a compound having a group containing a substituted allyloxy group having at least one substituent.

BEST MODE FOR CARRYING OUT THE INVENTION

Group Containing a Substituted Allyloxy Group

In the present invention, the group containing a substituted allyloxy group having at least two substituents may be any group so far as it functions as a group unstable to an acid, which is decomposed by the acid. Specific examples thereof include groups represented by the following formula (1):

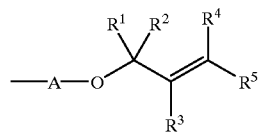

(1)

wherein $R^1$ to $R^5$ are independently selected from among a hydrogen atom, halogen atoms, a nitro group, a cyano group, alkyl groups which may be substituted, alkenyl groups which may be substituted, alkadienyl groups which may be substituted, and a vinyl group which may be substituted, at least two of $R^1$ to $R^5$ are substituents other than the hydrogen atom, $R^1$ and $R^4$, $R^3$ and $R^5$, and $R^4$ and $R^5$ may independently form a ring, the individual substituents each have at most 12 carbon atoms, and A is a single bond or a divalent organic group.

Namely, the substituted allyloxy group having at least two substituents is bonded directly or through a divalent organic group to a polymer.

Specific examples of $R^1$ to $R^5$ in the formula (1) include a hydrogen atom, a nitro group and a cyano group; and besides halogen atoms such as chlorine and bromine atoms; alkyl groups which may be substituted, such as methyl, ethyl, propyl, butyl, amyl, cyclopentyl, cyclohexyl, cycloheptyl, 1-methylcyclopentyl, 2-ethylcyclopentyl, 1-ethylcyclohexyl and 2-methylcyclohexyl groups; alkenyl group which may be substituted, such as vinyl, 1-propenyl, allyl, 1-butenyl, 3-butenyl, 1-pentenyl, 2-pentenyl, 4-pentenyl, hexenyl, 2-cyclobutenyl, 2-cyclopentenyl, 1-methyl-2-cyclopentenyl, 2-cyclohexenyl and 3-methyl-2-cyclohexenyl groups; cycloalkadienyl groups which may be substituted, such as 2,4-cyclopentadienyl, 1-methyl-2,4-cyclopentadienyl, 3-methyl-2,4-cyclopentadienyl, 3,4-dimethyl-2,4-cyclopentadienyl, 2,5-cyclohexadienyl and 3,5-dimethyl-2,5-cyclohexadienyl groups; and a vinyl group which may be substituted, such as a vinyl, 1-propenyl, 1-buten-1-yl, 1-buten-2-yl or 2-buten-2-yl group. Incidentally, in the specific examples of the substituents, the propyl means n-propyl or isopropyl, the butyl denotes n-butyl, isobutyl, s-butyl or t-butyl, and the amyl represents pentyl, 1-methylbutyl, 2-methylbutyl, 3-methylbutyl, 1-ethylpropyl, 1,1-dimethylpropyl, 1,2-dimethylpropyl or 2,2-dimethylpropyl. Further, $R^1$ and $R^4$ may be bonded together to form a ring such as cyclohexane or cyclopentene. Similarly, $R^3$ and $R^5$, and $R^4$ and $R^5$ may also form a ring. However, the formation of a ring may cause reduction in sensitivity of the resulting resist composition and is hence not very preferred.

Preferable examples of the substituents other than the hydrogen atom of $R^1$ to $R^5$ in the formula (1) are halogen atoms and various substituent groups having 1–4 carbon atoms with alkyl and alkenyl groups having 1–4 carbon atoms being particularly preferred.

A in the formula (1) is a single bond or a divalent organic group. Preferable examples thereof include groups represented by the following formula (2):

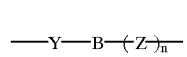

(2)

wherein B is a single bond or a divalent organic group having 1–10 carbon atoms, Y is a single bond, a divalent organic group having 1–4 carbon atoms, —Co— or —$CO_2$—, Z is —CO—, and n is an integer of 0–3, with the proviso that Z is bonded to the oxygen atom in the formula (1) when n is 1–3, while B is bonded to the oxygen atom in the formula (1) when n is 0.

In the formula (2), specific examples of the divalent organic group of B include linear, branched or cyclic alkylene groups which may be substituted, such as methylene, ethylene, propane-1,3-diyl, propane-1,2-diyl, butane-1,4-diyl, butane-2,2-diyl, pentane-1,5-diyl, hexane-1,6-diyl, cyclopentylene, cyclohexylene and 2-methylcyclohexylene; and linear, branched or cyclic alkenylene groups which may be substituted, such as vinylene, propenylene, butylene, hexenylene, 2-chloropentenylene, 3-ethylhexenylene, cyclohexenylene, 2-chlorocyclohexenylene, —CH=CH—CH=CH—, —$CH_2$C=CHCH$_2$CH=CH— and —CCl=CH—CH=CCl—. Besides, a divalent group represented by the formula (3):

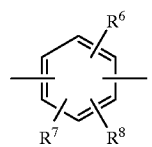

(3)

wherein $R^6$ to $R^8$ are independently a halogen atom or an alkyl group having 1–4 carbon atoms, or another divalent group such as —O—, —CO— or —$CO_2$— may be bonded in these residues or to a terminal thereof to form such groups as —$CH_2$—O—$CH_2$—, —$CH_2$—$C_6H_4$—O—$CH_2$—, —$CH_2$—$C_6H_4$—$CH_2$— and —$CH_2$—$C_6H_4$—.

In the formula (2), specific examples of the divalent organic group of Y include alkylene and alkenylene groups having 1–4 carbon atoms, such as methylene, ethylene, vinylene, propenylene and butylene.

Of these, preferable examples of A include a single bond; and besides divalent groups represented by the following formula (4):

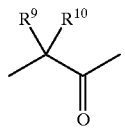

(4)

wherein $R^9$ and $R^{10}$ are independently a hydrogen atom, a halogen atom, an alkyl group which may be substituted, an alkenyl group which may be substituted, a phenyl group which may be substituted, or an aralkyl group which may be substituted, said individual substituents each having at most 10 carbon atoms, such as —CH$_2$CO—, —CH(CH$_3$)CO—, —C(CH$_3$)$_2$CO—, CCl$_2$CO—, —CH(Ph)CO— (in which (Ph) means a phenyl group; the same shall apply hereinafter) and —C(Ph)$_2$CO—; and divalent groups represented by the following formula (5):

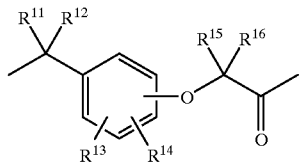

(5)

wherein $R^{11}$ to $R^{16}$ are independently a hydrogen atom, a halogen atom, an alkyl group which may be substituted, or an alkenyl group which may be substituted, said individual substituents each having at most 4 carbon atoms, such as —CH$_2$—C$_6$H$_4$—O—CH$_2$CO—, —CH(C$_2$H$_5$)—C$_6$H$_4$—O—CH$_2$CO—, —CH$_2$—(C$_6$H$_3$(CH$_3$))—O—CH(CH$_3$)CO— and CHCl—C$_6$H$_4$—O—CH$_2$CO—.

Specific examples of the substituents of the formulae (4) and (5) include halogen atoms, the same alkyl and alkenyl groups which may be substituted as those mentioned in $R^1$ to $R^5$ of the formula (1), and aralkyl groups which may be substituted, such as benzyl, 4-hydroxybenzyl, 4-methylbenzyl, phenethyl, 3-methylphenethyl, 2,4,6-trimethylphenethyl and 4-hydroxyphenethyl groups.

The substituted allyloxy groups according to the present invention have at least two substituents and prefer groups in which both hydrogen atoms at the 1-position are not substituted (groups free of any substituent at the 1-position) or groups in which both hydrogen atoms at the 1-position are substituted (1,1-di-substituted groups) to groups in which one of two hydrogen atoms at the 1-position is substituted (1-monosubstituted group) from the viewpoint of realizing higher sensitivity and resolution. Namely, both $R^1$ and $R^2$ in the formula (1) are preferably hydrogen atoms or substituents.

Specific examples of such groups represented by the formula (1) include 3-methyl-2-butenyloxycarbonylmethyloxy, 1-methyl-2-butenyloxycarbonylmethyloxy, 1-methyl-2-butenyloxycarbonylmethyloxy, 1,1-dimethyl-2-propenyloxycarbonylmethyloxy, 1,1-dimethyl-2-pentenyloxycarbonylmethyloxy, 2-cyclohexenyloxycarbonylmethyloxy, 4-(3-methyl-2-butenyloxycarbonylmethyloxy)benzyloxy, 4-(1-methyl-2-butenyloxycarbonylmethyloxy)benzyloxy, 2-(1,1-dimethyl-2-propenyloxycarbonylmethyloxy)benzyloxy and 4-(1,1-dimethyl-2-pentenyloxycarbonylmethyloxy)benzyloxy groups.

In the compound (C) having a group containing a substituted allyloxy group having at least one substituent, such a group is a group of the formula (1) in which at least one of $R^1$ to $R^5$ is a substituent other than a hydrogen atom.

As specific examples of the substituent allyloxy groups, may be mentioned groups represented by the following formulae (6) to (15):

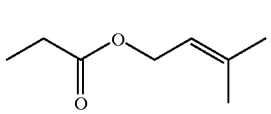

(6)

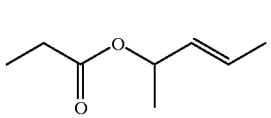

(7)

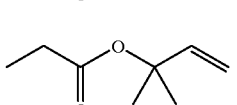

(8)

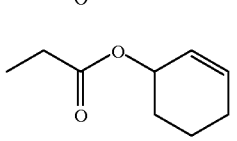

(9)

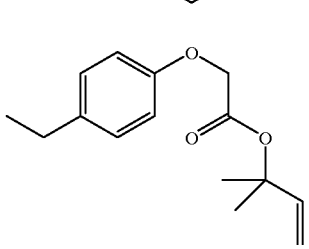

(10)

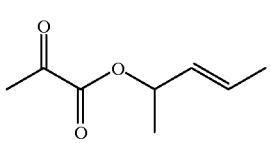

(11)

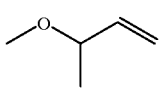

(12)

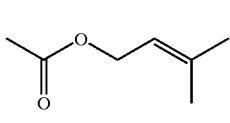

(13)

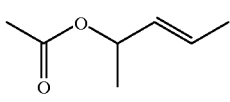

(14)

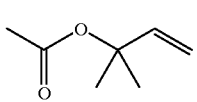

(15)

Polymer (a) Having Groups Cleavable by an Acid

The polymer (a) useful in the practice of the present invention functions as a resin binder and is a polymer which contains groups containing a substituted allyloxy group having at least two substituents. As described above, the substituted allyloxy group is bonded directly or through a divalent organic group to the polymer. In this polymer (a), the substituted allyloxy group is cleaved in the presence of an acid derived from the compound (b) which can form an acid upon exposure to active rays, so that the polymer turns alkali-soluble.

No particular limitation is imposed on a preparation process of such a polymer (a). For example, (1) a process in which after a resin to be used as a raw material (hereinafter may be referred to as "a base resin") is synthesized, a group containing the substituted allyloxy group is introduced into the resin in accordance with a method known per se in the art, and (2) a process wherein a monomer into which a group containing the substituted allyloxy group has been introduced in advance is subjected to anionic polymerization or cationic polymerization by itself, or a process wherein a monomer into which a group containing the substituted allyloxy group has been introduced in advance is subjected to anionic polymerization or cationic polymerization together with another monomer. In the process (1), a method for introducing the group containing the substituted allyloxy group includes a method in which a substituted allyl ester of a halogenated carboxylic acid corresponding to the intended substituted allyloxy group is subjected to a condensation reaction with hydroxyl groups in the resin under basic conditions, or the like. When the cationic polymerization is conducted in the process (2), a reaction is generally carried out at a low temperature.

The base resin used in synthesizing the polymer (a) in accordance with the process (1) may be either a homopolymer or a copolymer. Specific examples of such a polymer include resins having structural units derived from phenol or vinylphenol, such as vinylphenol resins such as polyvinylphenol resins and partially hydrogenated polyvinylphenol resins; phenolic resins such as novolak resins and partially hydrogenated novolak resins; polyvinyl alcohol resins; copolymers of vinylphenol or a derivative thereof with other monomers than the vinylphenols, such as styrene, styrene derivatives, (meth)acrylic esters and (meth)acrylic ester derivatives; and copolymers of two or more kinds of vinylphenols, and hydrogenated products thereof. Of these, resins (hereinafter generically referred to as the "vinylphenol type resin") which may be partially hydrogenated and have structural units derived from vinylphenol, such as the polyvinylphenol resins, partially hydrogenated polyvinylphenol resins, and homopolymers and copolymers making use of vinylphenol or derivatives thereof, are preferred with the partially hydrogenated polyvinylphenol resins being particularly preferred. When the vinylphenol type resin is used, no particular limitation is imposed on the upper limit of the proportion of the structural units derived from vinylphenol or a derivative thereof. However, the lower limit thereof is generally 5%, preferably 15%, more preferably 25%. When the hydrogenated vinylphenol type resin is used, the rate of hydrogenation varies according to the components of the resin. However, its upper limit is generally 50%, preferably 35%, more preferably 20% based on the aromatic unsaturated bonds in the resin, while its lower limit is generally 1%, preferably 3%, more preferably 5%.

Examples of the monomer having the substituted allyloxy group used in polymerizing into the resin in accordance with the process (2) include compounds in which the hydrogen atom of the hydroxyl group of vinylphenol has been substituted by a substituted allyl group, such as styrene compounds having a substituted allyloxy group; compounds in which the hydrogen atom of the hydroxyl group of vinylphenol has been substituted by "a group having a substituted allyloxy group", such as styrene compounds having a substituted allyloxycarbonyloxy group and styrene compounds having a substituted allyloxycarbonylalkyloxy group; and unsaturated carboxylic compounds to which a group containing a substituted allyloxy group has been bonded. When copolymers are obtained, other polymerizable monomers include vinylphenol which may be substituted, and styrene which may be substituted.

No particular limitation is imposed on the weight average molecular weight of the polymer (a) obtained by each of the above-described processes. However, the upper limit thereof is preferably 100,000, more preferably 20,000 from the viewpoint of resolution, while the lower limit thereof is preferably 1,000, more preferably 2,000 from the viewpoint of film-forming property.

With respect to the proportion of the substituted allyloxy groups in the polymer (a), it is generally introduced within a range of 0.01–0.99 groups per structural unit of the resin. However, the upper limit thereof is preferably 0.6 groups, more preferably 0.35 groups, while the lower limit thereof is preferably 0.05 groups, more preferably 0.1 group.

The rate of substitution of the resin binder obtained by substituting the hydrogen atoms of the phenolic hydroxyl groups in the vinylphenol type resin with the substituted allyloxy group varies according to the proportion of the phenolic hydroxyl groups in the polymer, but is generally 1–99%, preferably 5–60%, more preferably 10–35%.

Besides, the polymer (a) having groups cleavable by an acid as the polymer (a) may include a (co)polymer having structural units derived from an aromatic vinyl compound to which a group containing a substituted allyloxy group having at least two substituents has been bonded. This copolymer may include a copolymer having structural units derived from the aromatic vinyl compound to which the group containing a substituted allyloxy group having at least two substituents has been bonded, and structural units derived from an unsaturated carboxylic compound.

Preferable examples of the copolymer include copolymers containing structural units represented by the following formula (16), structural units represented by the following formula (17) and structural units represented by the following structural units (18).

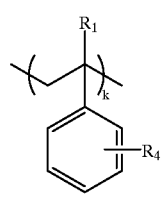

(16)

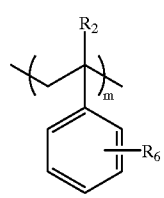

(17)

(18)

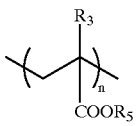

wherein $R_1$ to $R_3$ are independently selected from among a hydrogen atom, alkyl groups which have 1–4 carbon atoms and may be substituted, halogen atoms, a cyano group, and a nitro group, $R_4$ is a group containing a substituted allyloxy group having at least two substituents represented by the formula (1), $R_6$ is a hydrogen atom, a hydroxyl group, an alkyl group which has 1–4 carbon atoms and may be substituted, or a halogen atom, $R_5$ is a linear, branched or cyclic alkyl group which may be substituted, or a group represented by the following formula (20):

(20)

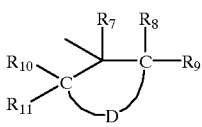

in which $R_7$ is an alkyl or alkenyl group which may be substituted, $R_8$ to $R_{11}$ are independently a hydrogen atom, a halogen atom, or an alkyl group which may be substituted, at least one of $R_8$ to $R_{11}$ is a hydrogen atom, and D is a divalent organic group, and k, m and n represent proportions of the respective structural units and satisfy the following respective relationships:

$0<k<0.95$;
$0<m<0.95$;
$0.05 \leq n \leq 0.60$; and
$0.1<k/(k+m)<1$ wherein the sum of the proportions of the respective structural units in the copolymer is 1.

Besides, as the polymer (a), may be mentioned a (co) polymer having structural units derived from an aromatic carboxylic compound to which a group containing a substituted allyloxy group having at least two substituents has been bonded. This copolymer may include a copolymer containing structural units derived from the aromatic carboxylic compound to which a group containing a substituted allyloxy group having at least two substituents has been bonded, and structural units derived from an aromatic vinyl compound. Preferable example of the copolymer include copolymers containing the structural units represented by the formula (17) and structural units represented by the following formula (19):

(19)

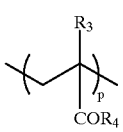

wherein $R_3$ has the same meaning as defined in the formula (18), $R_4$ is a group containing a substituted allyloxy group having at least two substituents represented by the formula (1), and m and p represent proportions of the respective structural units and satisfy the following respective relationships:

$0.40 \leq m \leq 0.95$; and
$0.05 \leq p \leq 0.60$ wherein the sum of the proportions of the respective structural units in the copolymer is 1.

The copolymers having the structural units represented by the formulae (16), (17) and (18) as essential structural units may be either block copolymers or random copolymers.

With respect to the weight average molecular weight of this polymer, the lower limit is generally 1,000, preferably 2,000, while the upper limit is generally 100,000, preferably 20,000. If the molecular weight is outside this range, the resolution of the resulting resist composition may be deteriorated in some cases.

In the formulae (16), (17) and (18), specific examples of $R_1$, $R_2$ and $R_3$ include a hydrogen atom; alkyl groups having 1–4 carbon atoms, such as methyl, ethyl, n-propyl, isopropyl, n-butyl, s-butyl and t-butyl groups, and substituted groups thereof in which at least one hydrogen atom is substituted by a halogen atom, an alkoxyl group or the like; halogen atoms such as fluorine, chlorine, bromine and iodine; a cyano group; and a nitro group.

The proportions of the structural units represented by the formulae (16), (17) and (18) are represented by k, m and n, respectively. When the sum of the respective structural units in the polymer is 1, they generally satisfy the following relationships:

$0<k<0.95$;
$0<m<0.95$;
$0.05 \leq n<0.60$; and
$0.1 \leq k/(k+m)<1$.

If the proportion k of the structural units represented by the formula (16) is too low, reduction in sensitivity and resolution, and deterioration in pattern form are invited on the resulting resist composition. If the proportion k is too high on the other hand, the contrast of a pattern formed from the resulting resist composition tends to lower. Besides, if the proportion m of the structural units represented by the formula (17) is too low, the resistance to etching of the resulting resist composition is lowered. If the proportion m is too high on the other hand, the solubility of the resulting resist composition in developers increases at its unexposed portion. Accordingly, the proportion (k/(k+m)) of the structural units represented by the formula (16) between the structural units represented by the formulae (16) and (17) is generally at least 0.1, preferably at least 0.2, more preferably at least 0.3 in terms of the lower limit, and generally lower than 1, preferably at most 0.8, more preferably at most 0.7 in terms of the upper limit.

No particular limitation is imposed on the proportion $(k+m)/(k+m+n)$ of the sum of the structural units represented by the formulae (16) and (17) to the whole resin so far as the above conditions are satisfied, but is preferably 0.40–0.95, more preferably 0.60–0.85. If this proportion is too low (namely, if the proportion of the structural units of the formula (18) is too high), the resistance to etching of the resulting resist composition may be lowered in some cases. If this proportion is too high (namely, if the proportion of the structural units of the formula (18) is too low) on the other hand, the light transmittance of the resulting resist composition is lowered, so that there is a possibility that its sensitivity and resolution may be deteriorated. Accordingly, the proportion n of the structural units represented by the formula (18) is 0.05, preferably 0.1 in terms of the lower limit, and generally 0.6, more preferably 0.5 in terms of the upper limit when the sum of the proportions of all the structural units is 1.

Further, when the proportion of the structural units represented by the formula (16) is high (usually, the proportion represented by (k/(k+m)) is 0.3 or higher), the substituent $R_5$ in the formula (18) may not be necessarily a group useful as the group unstable to an acid, so that an alkyl group which may be substituted but has no substituent at its 1-position, and does generally not function as the group unstable to an acid, such as a methyl, ethyl, n-propyl, n-butyl, 2-hydroxyethyl or 2-chloroethyl group, may be used.

On the other hand, when the proportion of the structural units represented by the formula (16) is high (usually, the proportion represented by (k/(k+m)) is lower than 0.3), the substituent $R_5$ is desirably a group unstable to an acid. Preferable examples of such a group include the groups represented by the formula (1). Those having an alkyl group which may be substituted but has no substituent at its 1-position, and a group represented by the formula (20) as $R_5$ may exist as the structural units represented by the formula (18) in the polymer.

Other structural units (hereinafter referred to as "the other structural units") than the structural units represented by the formulae (16), (17) and (18) may exist in the polymer within limits not impeding the effects of the present invention. The term "limits not impeding the effects of the present invention" as used therein means that the proportion of the other structural units is 0.2, preferably 0.1 in terms of the upper limit when the sum of the proportions of the structural units in the polymer is 1.

The polymer containing the structural units represented by the formulae (16), (17) and (18) used as a resin component in the present invention can be synthesized in accordance with a method known per se in the art. For example, a process in which a hydroxystyrene type monomer represented by the following formula (21):

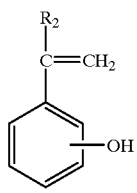

(21)

wherein $R_2$ is a hydrogen atom, an alkyl group which may be substituted and has 1–4 carbon atoms, a halogen atom, a cyano group or a nitro group, is copolymerized with a monomer represented by the following formula (22):

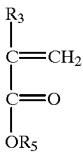

(22)

wherein $R_3$ and $R_5$ have the same meaning as defined in the formula (18), and a group represented by the formula (1) is then introduced into oxygen atoms of part of hydroxyl groups derived from the formula (21) in accordance with a method known per se in the art is mentioned.

The method for introducing the group represented by the formula (1) varies according to the kind of the divalent organic group A of the group represented by the formula (1) to be introduced. For example, a poly-substituted allyl halide is reacted with the copolymer of the monomer represented by the formula (21) with the monomer represented by the formula (22) under basic conditions, whereby a product in which A in the formula (1) is a single bond is obtained. When a poly-substituted allyl ester of a halogenated organic acid is reacted, a product in which A in the formula (1) is a group represented by the formula (4) is obtained. When a poly-substituted allyl ester of a halogenated alkylphenoxy-organic acid is reacted, a product in which A in the formula (1) is a group represented by the formula (5) is obtained.

Examples of the monomer represented by the formula (21) include 4-hydroxystyrene, 3-hydroxystyrene, 2-hydroxystyrene, α-methyl-4-hydroxystyrene, α-methyl-3-hydroxystyrene, α-methyl-2-hydroxystyrene and 4-hydroxy-3-methylstyrene.

Examples of the monomer represented by the formula (22) include methyl acrylate, ethyl acrylate, n-propyl acrylate, isopropyl acrylate, n-butyl acrylate, t-butyl acrylate, t-amyl acrylate, 2-hydroxyethyl acrylate, 3-hydroxypropyl acrylate, chloromethyl acrylate, 1-methylcyclopentyl acrylate, 1-methylcyclohexyl acrylate, methyl methacrylate, ethyl methacrylate, n-propyl methacrylate, isopropyl methacrylate, n-butyl methacrylate, t-butyl methacrylate, t-amyl methacrylate, 2-hydroxyethyl methacrylate, 3-hydroxypropyl methacrylate, broromethyl methacrylate, 1-methylcyclopentyl methacrylate and 1-methylcyclohexyl methacrylate.

Of these, linear alkyl(meth)acrylates, hydroxyalkyl(meth)acrylates and (meth)acrylates having a group represented by the formula (20) are preferred.

Examples of the poly-substituted allyl halide used in introducing the group represented by the formula (1) include 1,1-dimethylallyl bromide, 1,2-dimethylallyl bromide, 2,3-dimethylallyl bromide, 3,3-dimethylallyl bromide and 1-methyl-3-ethylallyl bromide. Examples of the poly-substituted allyl ester of the halogenated organic acid include 3-methyl-2-butenyl bromoacetate, 1-methyl-2-butenyl bromoacetate, 1,1-dimethyl-2-propenyl bromoacetate, 1,1-dimethyl-2-pentenyl bromoacetate, 2-cyclohexenyl bromoacetate, 3-methyl-2-butenyl chlorooxalate, 2-butenyl bromoacetate and 1-methyl-2-propenyl bromoacetate. Specific examples of the poly-substituted allyl ester of the halogenated alkylphenoxy-organic acid include 1-methyl-2-butenyl (4-bromomethyl) phenoxyacetate, 3-methyl-2-butenyl (4-bromomethyl) phenoxyacetate, 1,1-dimethyl-2-propenyl (4-bromomethyl) phenoxyacetate and 1,1-dimethyl-2-pentenyl (4-bromomethyl)phenoxyacetate.

Specific examples of the polymers having the structural units represented by the formulae (16), (17) and (18) include 4-(3-methyl-2-butenyloxycarbonylmethyloxy)styrene/4-hydroxystyrene/methyl acrylate copolymers, 4-(3-methyl-2-butenyloxycarbonylmethyloxy)styrene/4-hydroxystyrene/methyl methacrylate copolymers, 4-(3-methyl-2-butenyloxycarbonylmethyloxy)styrene/3-hydroxystyrene/methyl methacrylate copolymers, 4-(3-methyl-2-butenyloxycarbonylmethyloxy)styrene/4-hydroxystyrene/1-methylcyclohexyl acrylate copolymers, 4-(3-methyl-2-butenyloxycarbonylmethyloxy)styrene/4-hydroxystyrene/n-butyl methacrylate, 4-(3-methyl-2-butenyloxycarbonylmethyloxy)styrene/4-hydroxystyrene/ethyl methacrylate, 4-(3-methyl-2-butenyloxycarbonylmethyloxy)styrene/4-hydroxystyrene/2-hydroxyethyl methacrylate, 4-(3-methyl-2-butenyloxycarbonylmethyloxy)styrene/4-hydroxystyrene/1-methylcyclohexyl methacrylate, 4-(1-methyl-2-butenyloxycarbonylmethyloxy)styrene/4-hydroxystyrene/n- butyl methacrylate, 4-(1-methyl-2-butenyloxycarbonylmethyloxy)styrene/4-hydroxystyrene/ethyl methacrylate, 4-(1-methyl-2-butenyloxycarbonylmethyloxy)styrene/4-hydroxystyrene/2-hydroxyethyl methacrylate, 4-(1-methyl-2-butenyloxycarbonylmethyloxy)styrene/4-hydroxystyrene/1-methylcyclohexyl methacrylate, 4-(1,1-dimethyl-2-propenyloxycarbonylmethyloxy)styrene/4-hydroxystyrene/methyl methacrylate copolymers, 4-(1,1-dimethyl-2-propenyloxycarbonylmethyloxy)styrene/4-hydroxystyrene/ethyl methacrylate, 4-(1,1-dimethyl-2-propenyloxycarbonylmethyloxy)styrene/4-hydroxystyrene/t-butyl acrylate copolymers, 4-(1,1-dimethyl-2-propenyloxycarbonylmethyloxy)styrene/4-hydroxystyrene/t-butyl methacrylate copolymers, 4-(1,1-dimethyl-2-propenyloxycarbonylmethyloxy)styrene/4-hydroxystyrene/1-methylcyclohexyl methacrylate copolymers, 4-(2-cyclohexenyloxycarbonylmethyloxy)styrene/3-hydroxystyrene/ethyl methacrylate copolymers, 4-[4-(3-methyl-2-butenyloxycarbonylmethyloxy)benzyloxy] styrene/4-hydroxystyrene/methyl methacrylate copolymers, 4-[4-(3-methyl-2-butenyloxycarbonylmethyloxy) benzyloxy]styrene/4-hydroxystyrene/1-methylcyclopentyl methacrylate copolymers, 4-[4-(3-methyl-2-butenyloxycarbonylmethyloxy)benzyloxy]styrene/4-hydroxystyrene/1-methylcyclohexyl methacrylate copolymers, 4-[4-(3-methyl-2-butenyloxycarbonylmethyloxy)benzyloxy]styrene/3-hydroxystyrene/n-propyl methacrylate copolymers, 4-(3-methyl-2-butenyloxycarbonylcarbonyloxymethyloxy) styrene/2-hydroxystyrene/methyl acrylate copolymers and 4-(3-methyl-2-butenyloxycarbonyloxymethyloxy)styrene/4-hydroxystyrene/1-methylcyclohexyl methacrylate copolymers.

The copolymers having the structural units represented by the formulae (17) and (19) can be obtained preferably by copolymerizing a monomer capable of giving the structural units represented by the formula (17) and a (meth)acrylic compound having a group represented by the formula (1), i.e., a compound in which the hydrogen atom of the carboxyl group in (meth)acrylic acid has been substituted by such a substituted allyloxy group (or a substituted allyloxy group-containing group) as A in the general formula (1) is a divalent organic group. Other structural units such as the structural unit represented by the formula (18) may exist as the third component within limits not impeding the object of the present invention. Specific examples of the copolymers include 4-hydroxystyrene/3-methyl-2-butenyl(meth) acrylate copolymers. From the viewpoint of properties such as sensitivity, resolution and pattern form, proportions m and p of the respective structural units represented by the formulae (17) and (19) are generally within the following respective ranges:

0.45≦m≦0.95; and 0.05≦p≦060 wherein the sum of the proportions m and p is 1.

Photo-Induced Acid Generator (b)

No particular limitation is imposed on the compound (b), which forms an acid upon exposure to active rays, useful in the practice of the present invention so far as it is a substance (hereinafter referred to as "PAG") which generates a Brφhnsted acid or Lewis acid upon irradiation of (exposure to) active rays (activated radiation). Known compounds such as onium salts, halogenated organic compounds, quinonediazide compounds, α,α-bis(sulfonyl)diazomethane compounds, α-carbonyl-α-sulfonyldiazomethane compounds, sulfone compounds, organic acid ester compounds, organic acid amide compounds and organic acid imide compounds may be used.

Examples of the onium salts include diazonium salts, ammonium salts, iodonium salts such as triphenyliodonium salts and triflate, sulfonium salts such as triphenylsulfonium triflate, phosphonium salts, arsonium salts and oxonium salts.

Examples of the halogenated organic compounds include halogen-containing oxadiazole compounds, halogen-containing triazine compounds, halogen-containing acetophenone compounds, halogen-containing benzophenone compounds, halogen-containing sulfoxide compounds, halogen-containing sulfone compounds, halogen-containing thiazole compounds, halogen-containing oxazole compounds, halogen-containing triazole compounds, halogen-containing 2-pyrrone compounds, halogen-containing heterocyclic compounds other than those mentioned above, halogen-containing aliphatic hydrocarbon compounds, halogen-containing aromatic hydrocarbon compounds and sulfenyl halide compounds. Specific examples thereof include halogen-containing flame retardants such as tris(2,3-dibromopropyl) phosphate, tris(2,3-dibromo-3-chloropropyl) phosphate, tetrabromochlorobutane, hexachlorobenzene, hexabromobenzene, hexabromocyclododecane, hexabromobiphenyl, allyl tribromophenyl ether, tetrachlorobisphenol A, tetrabromobisphenol A, bis-(chloroethyl) ether of tetrachlorobisphenol A, bis-(bromoethyl) ether of tetrabromobisphenol A, bis-(2,3-dichloropropyl) ether of bisphenol A, bis-(2,3-dibromopropyl) ether of bisphenol A, bis-(2,3-dichloropropyl) ether of tetrachlorobisphenol A, bis-(2,3-dibromopropyl) ether of tetrabromobisphenol A, tetrachlorobisphenol S, tetrabrombisphenol S, bis (chloroethyl) ether of tetrachlorobisphenol S, bis (bromoethyl) ether of tetrabromobisphenol S, bis(2,3-dichloropropyl) ether of bisphenol S, bis(2,3-dibromopropyl) ether of bisphenol S, tris(2,3-dibromopropyl) isocyanulate, 2,2-bis(4-hydroxy-3,5-dibromophenyl)propane and 2,2-bis(4-(2-hydroxyethoxy)-3,5-dibromophenyl propane; and organo-chloric pesticides such as dichlorodiphenyltrichloroethane, pentachlorophenol, 2,4,6-trichlorophenyl 4-nitrophenyl ether, 2,4-dichlorophenyl 3'-methoxy-4'-nitrophenyl ether, 2,4-dichlorophenoxyacetic acid, 4,5,6,7-tetrachlorophthalide, 1,1-bis(4-chlorophenyl)ethanol, 1,1-bis(4-chlorophenyl)-2,2,2-trichloroethanol, 2,3,4',5-tetrachlorodiphenyl sulfide and 2,4,4',5 -tetrachlorodiphenyl sulfone.

Specific examples of the quinonediazide compounds include sulfonic acid esters of quinonediazide derivatives such as 2-benzoquinonediazide-4-sulfonic acid ester, 1,2-naphthoquinonediazide-4-sulfonic acid ester, 1,2-naphthoquinonediazide-5-sulfonic acid ester, 2,1-naphthoquinonediazide-4-sulfonic acid ester and 2,1-benzoquinonediazide-5-sulfonic acid ester; and sulfonic acid chlorides of quinonediazide derivatives such as 1,2-benzoquinone-2-diazide-4-sulfonic acid chloride, 1,2-naphthoquinone-2-diazide-4-sulfonic acid chloride, 1,2-naphthoquinone-2-diazide-5-sulfonic acid chloride, 1,2-naphthoquinone-1-diazide-6-sulfonic acid chloride and 1,2-benzoquinone-1-diazide-5-sulfonic acid chloride.

Examples of the α,α-bis(sulfonyl)diazomethane compounds include α,α-bis(sulfonyl)diazomethanes, which each have an unsubstituted, or symmetrically or unsymmetrically substituted alkyl, alkenyl, aralkyl, aromatic or heterocyclic group.

Specific examples of the α-carbonyl-α-sulfonyldiazomethane compounds include α-carbonyl-α- sulfonyldiazomethanes, which each have an unsubstituted, or symmetrically or unsymmetrically substituted alkyl, alkenyl, aralkyl, aromatic or heterocyclic group.

Specific examples of the sulfone compounds include sulfone compounds and disulfone compounds, which each have an unsubstituted, or symmetrically or unsymmetrically substituted alkyl, alkenyl, aralkyl, aromatic or heterocyclic group.

Examples of the organic acid esters include carboxylic acid esters, sulfonic acid esters and phosphoric acid esters. Examples of the organic acid amides include carboxylic acid amides, sulfonic acid amides and phosphoric acid amides. Examples of the organic acid imides include carboxylic acid imides, sulfonic acid imides and phosphoric acid imides.

Of the organic acid esters, the sulfonic acid esters are particularly useful. Specific preferable examples of sulfonic acid esters usable include partial sulfonic acid esters of polyhydric phenols, such as those represented by the following formulae (23) to (27):

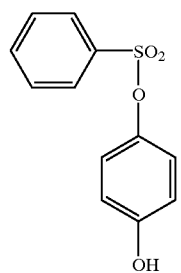
(23)

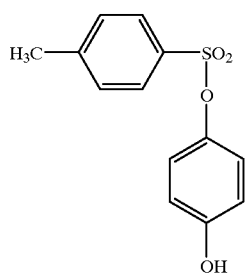
(24)

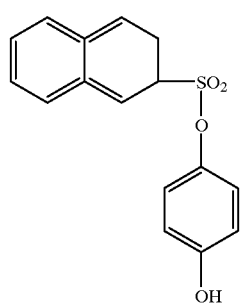
(25)

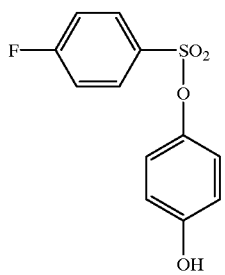
(26)

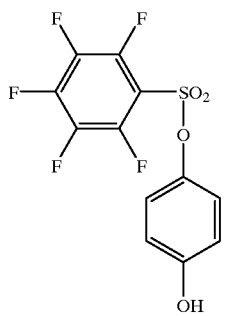
(27)

Such sulfonic acid esters can be synthesized from commercially available compounds in accordance with a method known per se in the art.

These PAGs may be used either singly or in any combination thereof. The proportion of these PAGs to be incorporated is generally 0.01 part by weight, preferably 0.2 parts by weight in terms of the lower limit per 100 parts by weight of the polymer (a) having groups cleavable by an acid used in the present invention, and generally 50 parts by weight, preferably 30 parts by weight in terms of the upper limit. Proportions lower than 0.01 part by weight result in a resist composition substantially impossible to form any pattern. On the other hand, proportions exceeding 50 parts by weight result in a resist composition which causes problems that it tends to cause partial insolubilization upon development, and the form of a pattern formed therefrom is deteriorated. Such a low or high proportion is hence not preferable from the viewpoint of resist performance.

Organic Solvent and the Like

The resist composition according to the present invention is used in a state that it is dissolved in a solvent. As the solvent, there may be used those commonly employed as solvents for resist compositions. Examples thereof include ketones such as acetone, methyl ethyl ketone, cyclohexanone, cyclopentanone and cycloheptanone; alcohols such as n-propanol, isopropanol, n-butanol, isobutanol, t-butanol and cyclohexanol; ethers such as ethylene glycol dimethyl ether, ethylene glycol diethyl ether and dioxane; alcohol ethers such as ethylene glycol dimethyl ether, ethylene glycol monoethyl ether, propylene glycol monomethyl ether and propylene glycol monoethyl ether; esters such as propyl formate, butyl formate, propyl acetate, butyl acetate, methyl propionate, ethyl propionate, methyl butyrate and ethyl butyrate; esters of hydroxycarboxylic acids, such as methyl 2-hydroxypropionate, ethyl 2-hydroxypropionate, methyl 2-methoxypropionate and ethyl 2-methoxypropionate; cellosolve esters such as cellosolve acetate, methylcellosolve acetate, ethylcellosolve acetate, propylcellosolve acetate and butylcellosolve acetate; propylene glycols such as propylene glycol, propylene glycol monomethyl ether acetate, propylene glycol monoethyl ether acetate and propylene glycol monobutyl ether; diethylene glycols such as diethylene glycol monomethyl ether, diethylene glycol monoethyl ether, diethylene glycol dimethyl ether and diethylene glycol diethyl ether; halogenated hydrocarbons such as trichloroethylene; aromatic hydrocarbons such as toluene and xylene; and polar solvents such as N,N-dimethylformamide, N,N-dimethylacetamide, dimethylformamide, N-methylacetamide and N-methylpyrrolidone. These solvents may be used either singly or in any combination thereof. These solvents are used in an amount sufficient to uniformly dissolve the individual components.

In the present invention, additives commonly added to resist compositions, for example, those compatible with the above components, such as surfactants, storage stabilizers, sensitizers and anti-striation agents, may be contained as additives.

An aqueous solution of an alkali is generally used as a developer for the resist composition of the present invention. Specific examples thereof include aqueous solutions of inorganic alkalis such as sodium hydroxide, potassium hydroxide, sodium silicate and ammonia; aqueous solutions of primary amines such as ethylamine and propylamine; aqueous solutions of secondary amines such as diethylamine and dipropylamine; aqueous solutions of tertiary amines such as trimethylamine and triethylamine; aqueous solutions of alcohol amines such as diethylethanolamine and triethanolamine; and aqueous solutions of quaternary ammonium hydroxides such as tetramethylammonium hydroxide, tetraethylammonium hydroxide, trimethylhydroxymethylammonium hydroxide, triethylhydroxymethylammonium hydroxide and trimethylhydroxyethylammonium hydroxide. As needed, a water-soluble organic solvent such as methanol, ethanol, propanol or ethylene glycol, a surfactant, a dissolution inhibitor for the resin and/or the like may be added to the aqueous alkali solution.

The resist composition according to the present invention optionally comprises the additives in addition to the polymer (a) and photo-induced acid generator (b) as described above and is generally dissolved in a solvent to use it as a resist composition solution.

For example, the solution of this resist composition is applied onto the surface of a substrate such as a silicon wafer by a method known per se in the art and then dried to remove the solvent, whereby a resist film can be formed. As the coating method used at this time, spin coating can be recommended in particular.

The exposure of the resist composition for forming a pattern can be conducted by exposing it to far ultraviolet radiation, KrF excimer laser beam or electron beam. A heat treatment (post-exposure bake) is further conducted, whereby the sensitivity of the resist composition can be more enhanced.

The resist composition comprising, as essential components, three components of the resin binder (A), the photo-induced acid generator (B) and the compound (C) having a group cleavable by an acid will hereinafter be described.

Resin Binder (A)

As the resin binder (A) useful in the practice of the present invention, any resin may be used so far as it is a resin soluble in an alkaline developer or a resin which has groups unstable to an acid and can turn soluble in the alkaline developer by their decomposition. Examples thereof include novolak resins, partially hydrogenated novolak resins, polyhydroxystyrene and partially hydrogenated polyhydroxystyrene. Further, copolymers of a monomer having a phenolic hydroxyl group with a styrene derivative, (meth)acrylic acid derivative and/or the like, resins obtained by copolymerizing two or more kinds of monomers having a phenolic hydroxyl group, and the like may be used.

Further, resins (hereinafter referred to as "modified resins") modified with a group unstable to an acid or a group containing a group unstable to an acid may be used. The modified resins are preferred in order to more enhance performance characteristics such as resolution and contrast. Example of the group unstable to an acid include groups known as groups cleavable by an acid. Specific examples thereof include ethers, esters and carbonates of tertiary alkyls such as t-butyl, t-amyl, 1-methylcyclopentyl and 1-methylcyclohexyl. Besides, ethers, esters and carbonates of allyl groups having a substituent may also be used as useful groups unstable to an acid.

No particular limitation is imposed on the molecular weight of the above resin. However, the upper limit thereof is preferably 100,000, more preferably 30,000 from the viewpoint of resolution, while the lower limit thereof is preferably 1,000, more preferably 2,000 from the viewpoint of film-forming property. The resin useful in the practice of the present invention may be obtained in accordance with a method known per se in the art.

Photo-Induced Acid Generator (B)

As the compound (B) which can form an acid upon exposure to active rays, there may be used the compounds described above.

Compound (C)

The compound (C) having a group cleavable by an acid used in the present invention is a compound having a group containing a substituted allyloxy group having at least one substituent. The group containing this substituted allyloxy group may be any group so far as it functions as a group unstable to an acid, which is decomposed by the acid. Specific examples thereof include groups represented by the above-described formula (1).

In the case of the compound (C), a compound to which the substituted allyloxy group is directly bonded is more easily synthesized. In such a case, the group containing the substituted allyloxy group may be a substituted allyloxy group represented by the following formula (28):

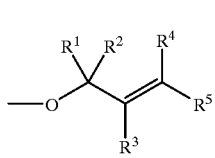

(28)

wherein $R^1$ to $R^5$ are independently selected from among a hydrogen atom, halogen atoms, a nitro group, a cyano group, alkyl groups which may be substituted, alkenyl groups which may be substituted, alkadienyl groups which may be substituted, and a vinyl group which may be substituted, at least one of $R^1$ to $R^5$ is a substituent other than the hydrogen atom, $R^1$ and $R^4$, $R^3$ and $R^5$, and $R^4$ and $R^5$ may independently form a ring, and the individual substituents each have at most 12 carbon atoms.

The compound (C) is preferably a compound having a structure that the substituted allyloxy group having at least one substituent is bonded directly or through a divalent organic group to an aromatic compound or an organic compound having at least two rings and at least 10 carbon atoms.

As specific examples of compounds having preferable substituted allyloxy groups according to the present invention, may be mentioned compounds represented by the following formula (29):

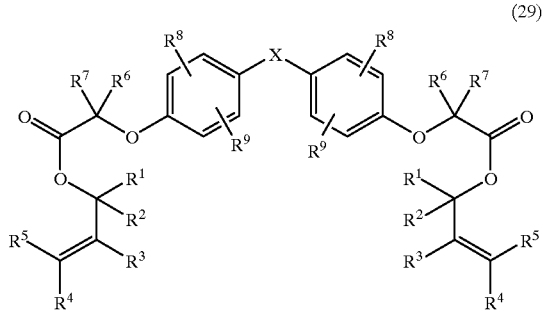

(29)

wherein $R^1$ to $R^5$ are independently selected from among a hydrogen atom, halogen atoms, a nitro group, a cyano group, alkyl groups which may be substituted, alkenyl groups which may be substituted, alkadienyl groups which may be substituted, and a vinyl group which may be substituted, at least one of $R^1$ to $R^5$ is a substituents other than the hydrogen atom, $R^1$ and $R^4$, $R^3$ and $R^5$, and $R^4$ and $R^5$ may independently form a ring, $R^6$ and $R^7$ are independently a hydrogen atom or an alkyl group which may be substituted, $R^8$ and $R^9$ are independently a hydrogen atom, a halogen atom, an alkyl group, a cyano group or a nitro group, X is a divalent organic group, and the individual substituents each have at most 12 carbon atoms.

Specific examples of such compounds may include compounds of the following formulae (30) to (46):

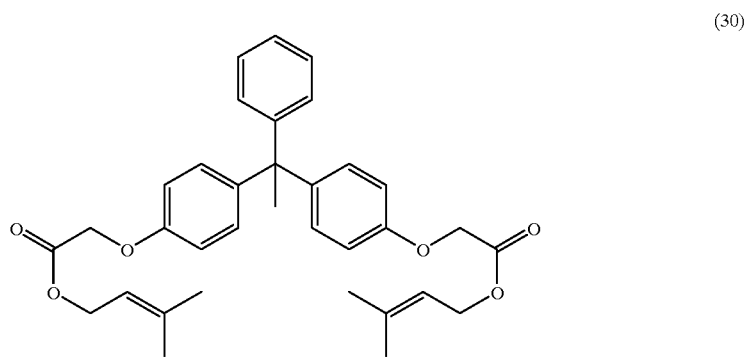

(30)

(31)

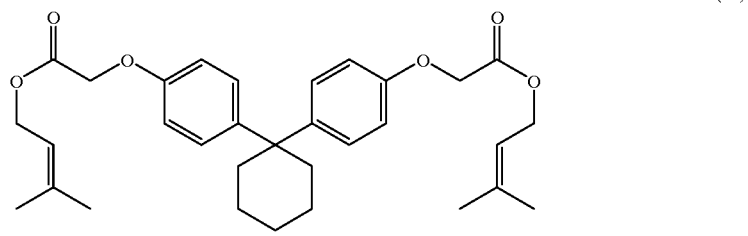

(32)

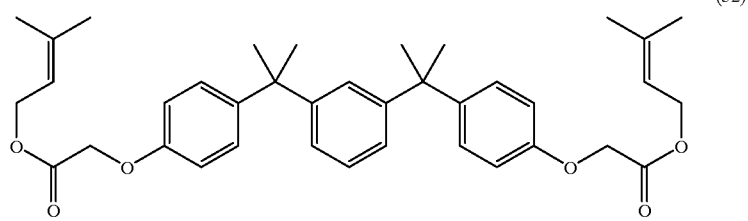

(33)

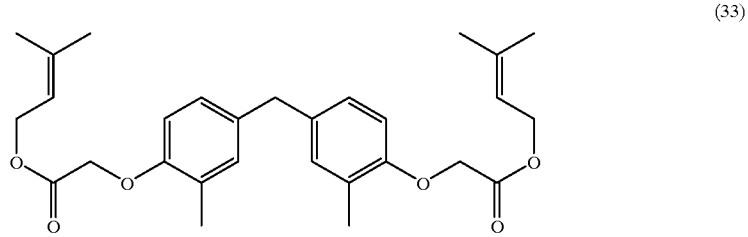

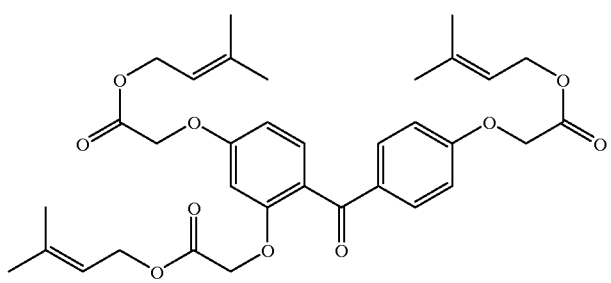
(34)
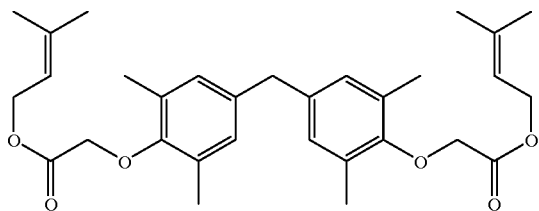
(35)
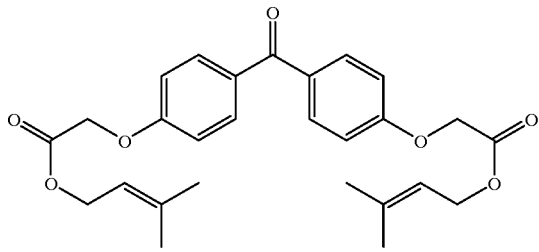
(36)
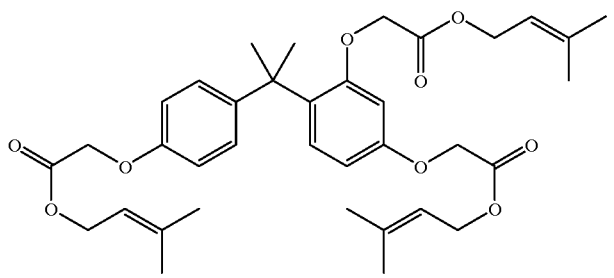
(37)
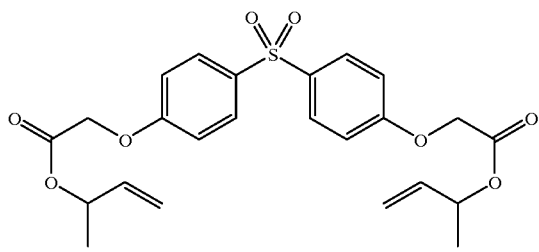
(38)
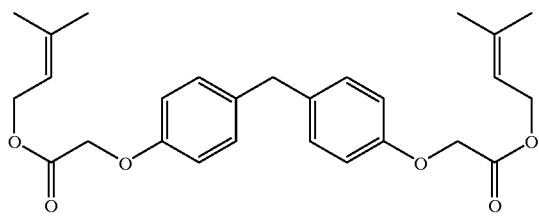
(39)

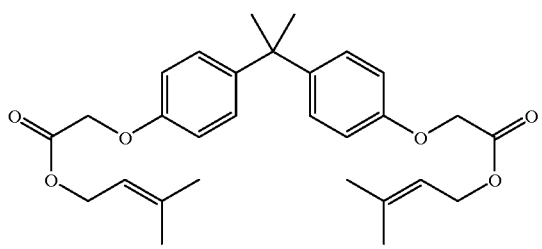
(40)
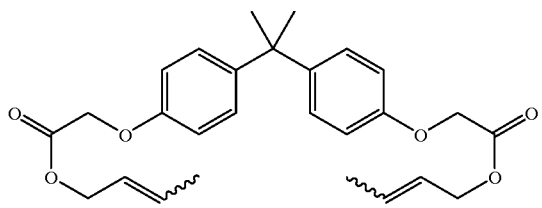
(41)
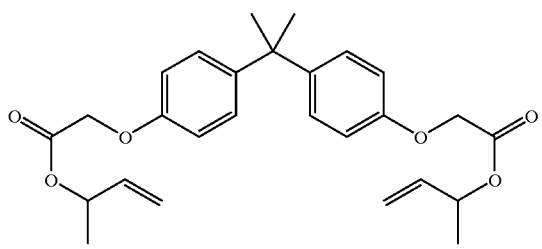
(42)
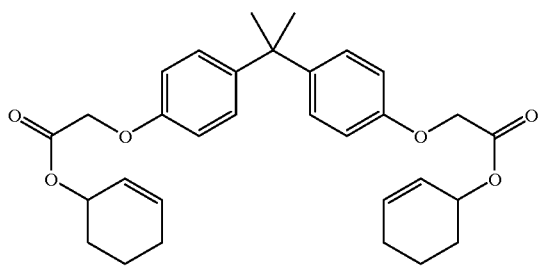
(43)
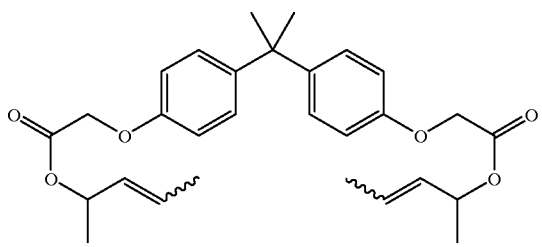
(44)
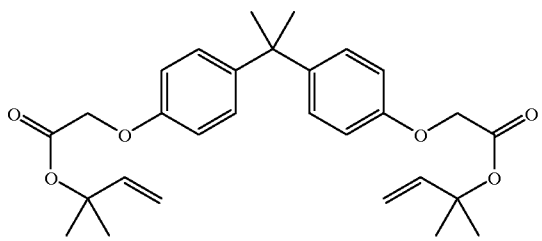
(45)

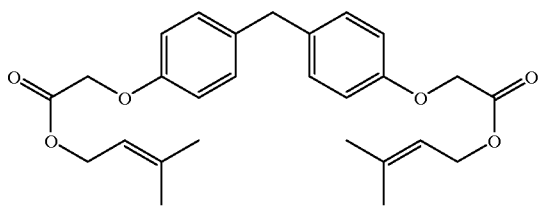

(46)

Specific examples of compounds having preferable substituted allyloxy groups according to the present invention may include compounds represented by the following formula (47):

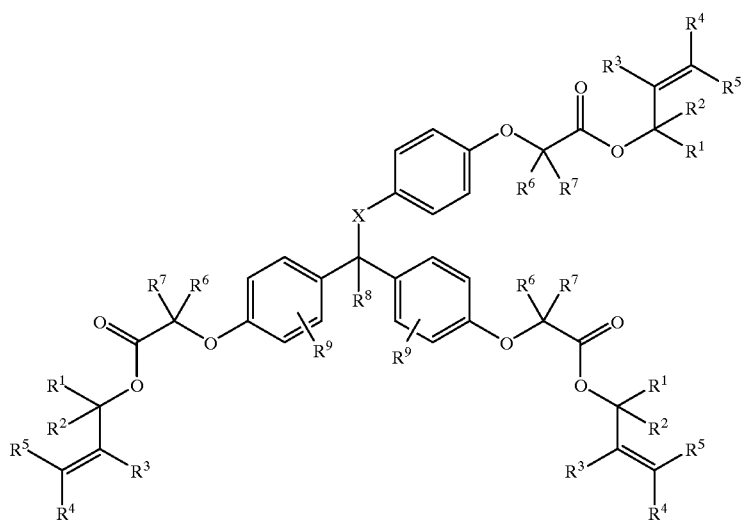

(47)

wherein $R^1$ to $R^5$ are independently selected from among a hydrogen atom, halogen atoms, a nitro group, a cyano group, alkyl groups which may be substituted, alkenyl groups which may be substituted, alkadienyl groups which may be substituted, and a vinyl group which may be substituted, at least one of $R^1$ to $R^5$ is a substituents other than the hydrogen atom, $R^1$ and $R^4$, $R^3$ and $R^5$, and $R^4$ and $R^5$ may independently form a ring, $R^6$ to $R^8$ are independently a hydrogen atom or an alkyl group, $R^9$ is a hydrogen atom, a halogen atom, an alkyl group, a cyano group or a nitro group, X is a divalent organic group, and the individual substituents each have at most 12 carbon atoms.

Specific examples of such compounds may include compounds of the following formulae (48) to (49):

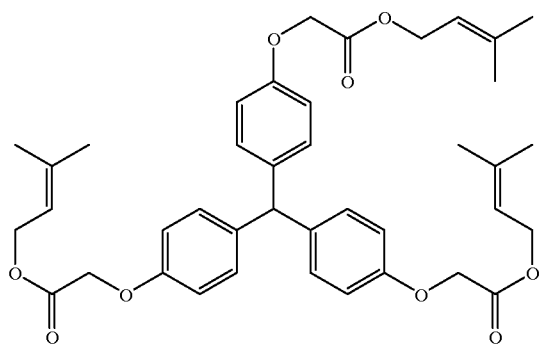

(48)

-continued

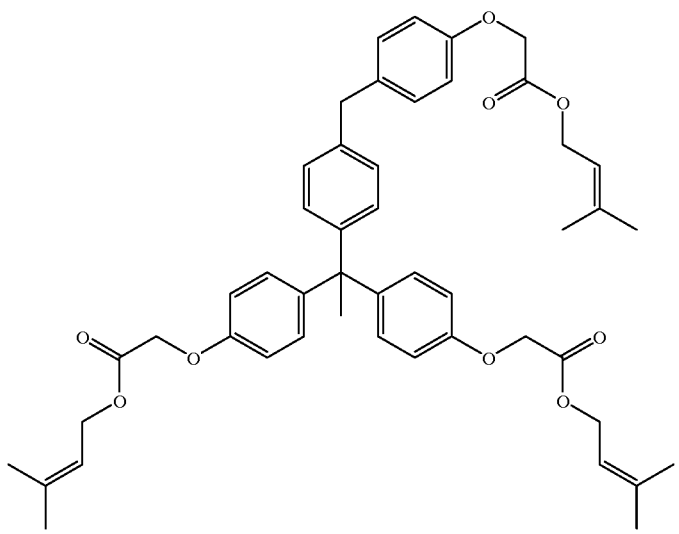

(49)

Specific examples of compounds having preferable substituted allyloxy groups according to the present invention may include compounds represented by the following formula (50):

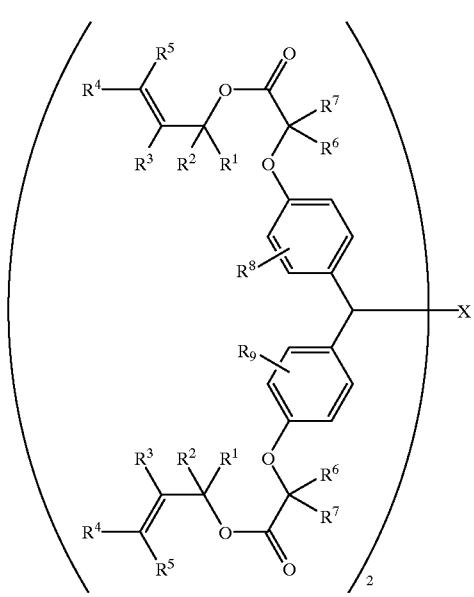

(50)

wherein $R^1$ to $R^5$ are independently selected from among a hydrogen atom, halogen atoms, a nitro group, a cyano group, alkyl groups which may be substituted, alkenyl groups which may be substituted, alkadienyl groups which may be substituted, and a vinyl group which may be substituted, at least one of $R^1$ to $R^5$ is a substituents other than the hydrogen atom, $R^1$ and $R^4$, $R^3$ and $R^5$, and $R^4$ and $R^5$ may independently form a ring, $R^6$ and $R^7$ are independently a hydrogen atom or an alkyl group, $R^8$ and $R^9$ are independently a hydrogen atom, a halogen atom, an alkyl group, a cyano group or a nitro group, X is a single bond or a divalent organic group, and the individual substituents each have at most 12 carbon atoms.

Specific examples of such compounds may include compounds of the following formulae (51) and (52):

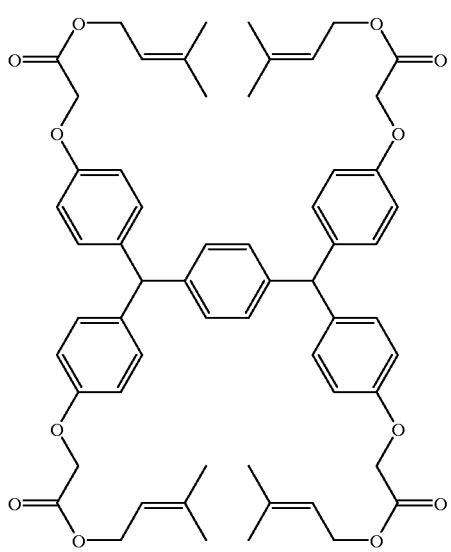

(51)

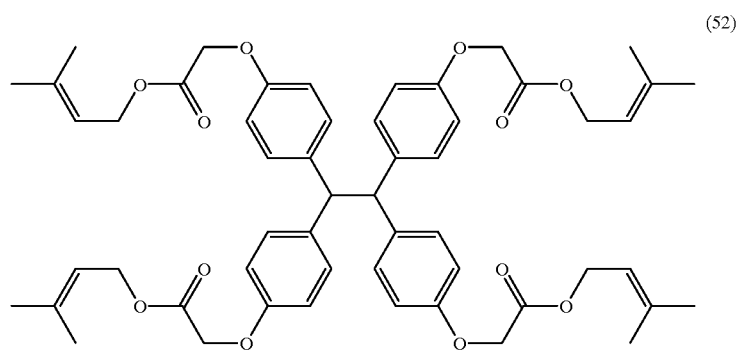

(52)

Specific examples of compounds having preferable substituted allyloxy groups according to the present invention may include compounds represented by the following formula (53):

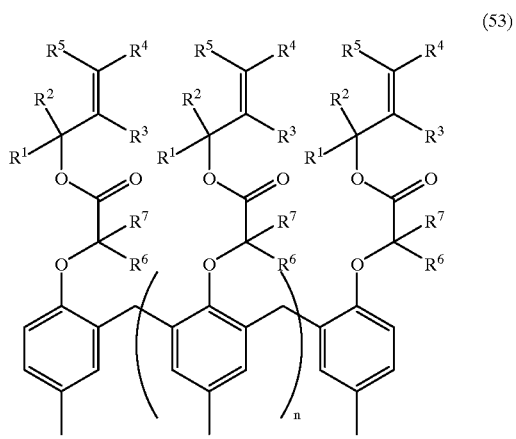

(53)

wherein $R^1$ to $R^5$ are independently selected from among a hydrogen atom, halogen atoms, a nitro group, a cyano group, alkyl groups which may be substituted, alkenyl groups which may be substituted, alkadienyl groups which may be substituted, and a vinyl group which may be substituted, at least one of $R^1$ to $R^5$ is a substituents other than the hydrogen atom, $R^1$ and $R^4$, $R^3$ and $R^5$, and $R^4$ and $R^5$ may independently form a ring, $R^6$ and $R^7$ are independently a hydrogen atom or an alkyl group, n is an integer, preferably 1–10, and the individual substituents each have at most 12 carbon atoms.

Specific examples of such compounds may include compounds of the following formulae (54) to (57):

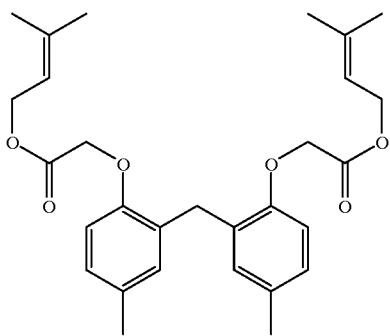
(54)
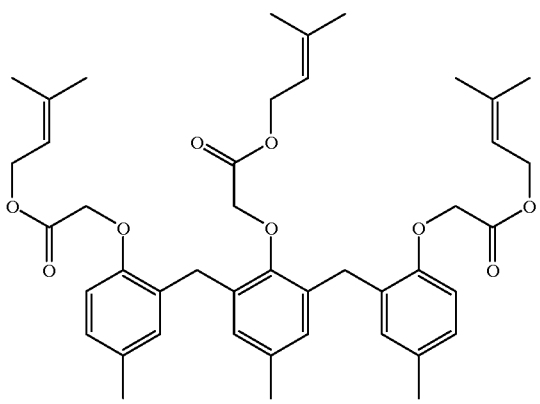
(55)
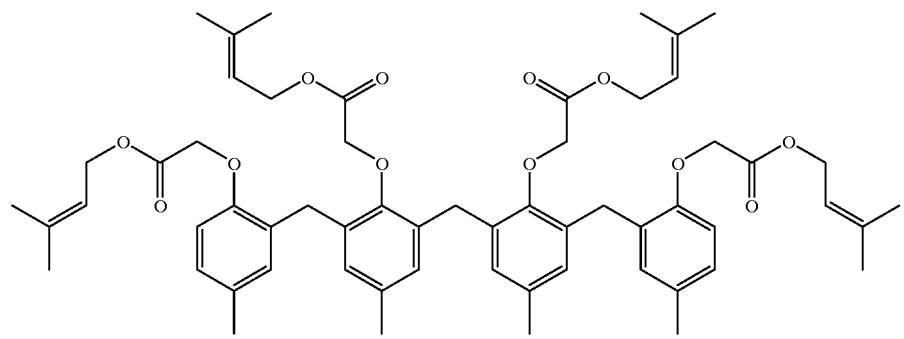
(56)
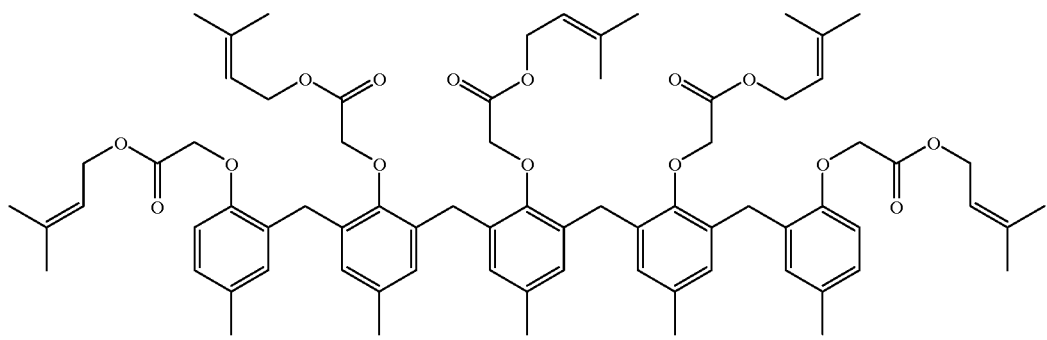
(57)

Specific examples of compounds having a preferable substituted allyloxy group according to the present invention may include compounds represented by the following formula (58):

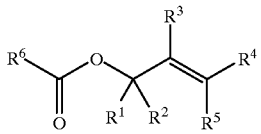
(58)

wherein $R^1$ to $R^5$ are Independently selected from among a hydrogen atom, halogen atoms, a nitro group, a cyano group, alkyl groups which may be substituted, alkenyl groups which may be substituted, alkadienyl groups which may be substituted, and a vinyl group which may be substituted, at least one of $R^1$ to $R^5$ is a substituents other than the hydrogen atom, $R^1$ and $R^4$, $R^3$ and $R^5$, and $R^4$ and $R^5$ may independently form a ring, the above substituents each have at most 12 carbon atoms, and $R^6$ is a monovalent organic group having at least two rings and at least 10 carbon atoms.

Specific examples of such compounds may include compounds of the following formulae (59) to (61):

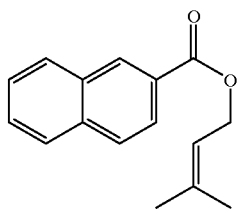
(59)

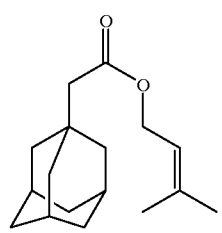
(60)

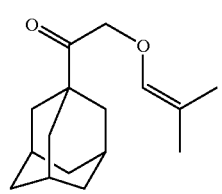
(61)

Specific examples of compounds having preferable substituted allyloxy groups according to the present Invention may Include compounds represented by the following formula (62):

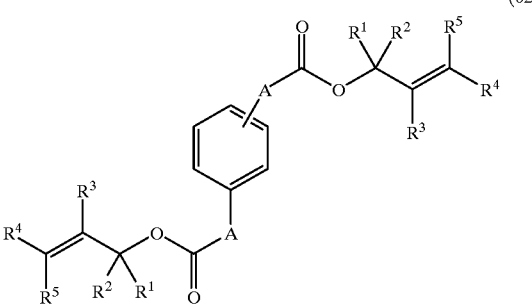
(62)

wherein $R^1$ to $R^5$ are independently selected from among a hydrogen atom, halogen atoms, a nitro group, a cyano group, alkyl groups which may be substituted, alkenyl groups which may be substituted, alkadienyl groups which may be substituted, and a vinyl group which may be substituted, at least one of $R^1$ to $R^5$ is a substituents other than the hydrogen atom, $R^1$ and $R^4$, $R^3$ and $R^5$, and $R^4$ and $R^5$ may independently form a ring, A is a single bond or a divalent organic group, and the individual substituents each have at most 12 carbon atoms.

Specific examples of such compounds may include compounds of the following formulae (63) to (66):

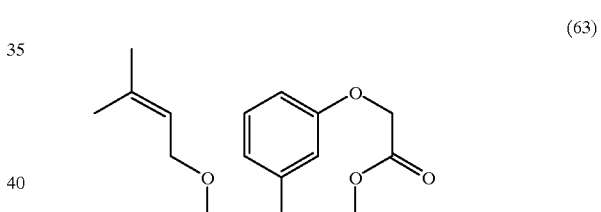
(63)

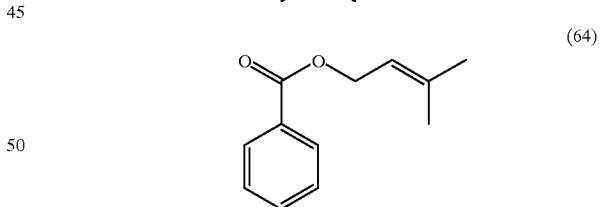
(64)

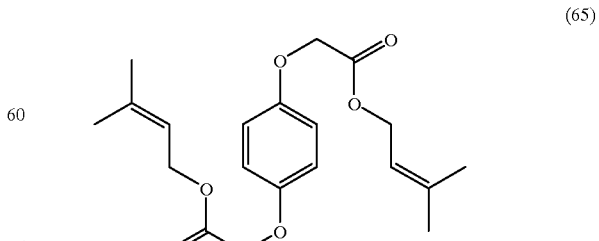
(65)

(66)

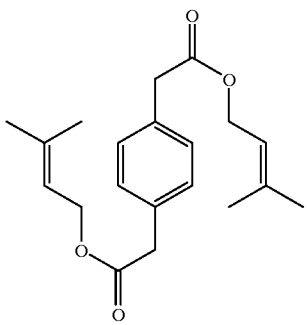

Specific examples of compounds having preferable substituted allyloxy groups according to the present invention may include compounds represented by the following formula (67):

(67)

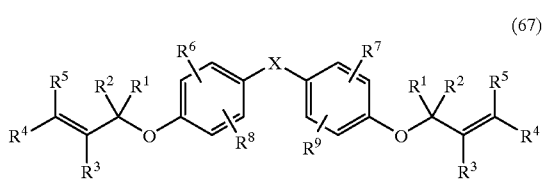

wherein $R^1$ to $R^5$ are independently selected from among a hydrogen atom, halogen atoms, a nitro group, a cyano group, alkyl groups which may be substituted, alkenyl groups which may be substituted, alkadienyl groups which may be substituted, and a vinyl group which may be substituted, at least one of $R^1$ to $R^5$ is a substituents other than the hydrogen atom, $R^1$ and $R^4$, $R^3$ and $R^5$, and $R^4$ and $R^5$ may independently form a ring, $R^6$ to $R^9$ are independently a hydrogen atom, a halogen atom, an alkyl group, a cyano group or a nitro group, X is a divalent organic group, and the individual substituents each have at most 12 carbon atoms.

Specific examples of such compounds may include compounds of the following formulae (68) to (73):

(68)

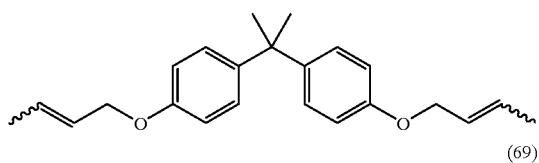

(69)

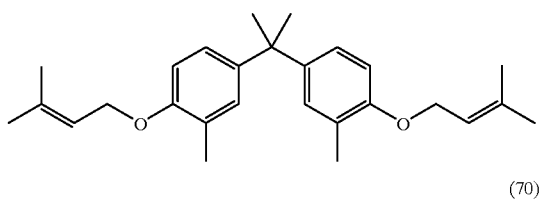

(70)

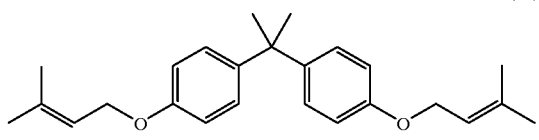

(71)

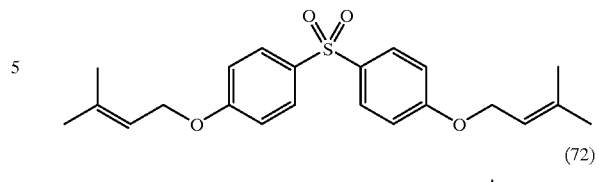

(72)

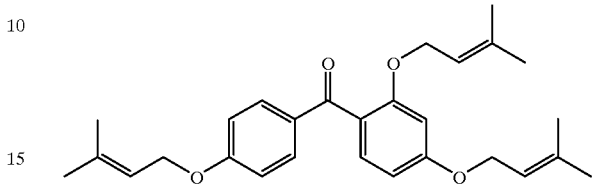

(73)

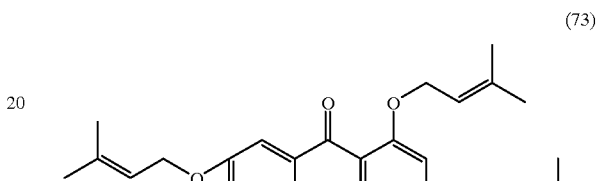

Specific examples of compounds having preferable substituted allyloxy groups according to the present invention may include compounds represented by the following formula (74):

(74)

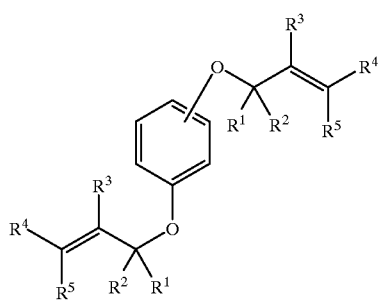

wherein $R^1$ to $R^5$ are independently selected from among a hydrogen atom, halogen atoms, a nitro group, a,cyano group, alkyl groups which may be substituted, alkenyl groups which may be substituted, alkadienyl groups which may be substituted, and a vinyl group which may be substituted, at least one of $R^1$ to $R^5$ is a substituents other than the hydrogen atom, $R^1$ and $R^4$, $R^3$ and $R^5$, and $R^4$ and $R^5$ may independently form a ring, X is a divalent organic group, and the individual substituents each have at most 12 carbon atoms.

Specific examples of such compounds may include compounds of the following formulae (75) and (76):

(75)

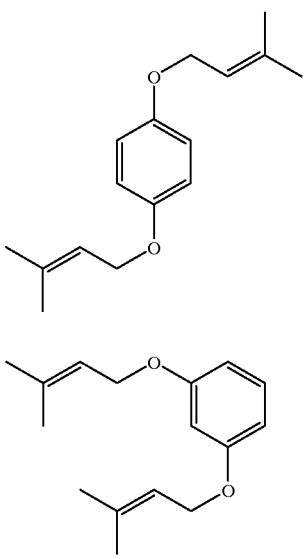

(76)

In the above general formulae, specific examples of the substituents represented by $R^1$ to $R^5$ may include the same substituents as those mentioned in the formula (1). Of these, alkyl groups having 1–4 carbon atoms are preferred.

The respective substituents represented by $R^6$ to $R^9$ in the general formula (29), $R^6$ to $R^8$ in the general formula (47), and $R^6$ and $R^7$ in the general formulae (50) and (53) are preferably hydrogen atoms or alkyl groups having 1–4 carbon atoms.

Specific examples of the divalent organic group represented by X in these general formulae include —SO$_2$—, —C(=O)—, groups represented by the following formula (77):

(77)

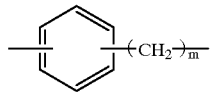

wherein m is 0 or 1, groups represented by the following formula (78):

(78)

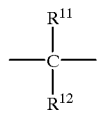

wherein $R^{11}$ and $R^{12}$ are independently a hydrogen atom, an alkyl group or a phenyl group, or $R^{11}$ and $R^{12}$ may form a cyclohexyl ring together, and both substituents each have at most 12 carbon atoms. Preferable examples of $R^{11}$ and $R^{12}$ in the formula (78) include a hydrogen atom, a methyl group, a phenyl group and a cyclohexyl ring formed together by $R^{11}$ and $R^{12}$.

Specific examples of the divalent organic group represented by A in the general formula (62) include groups represented by the formula (78) and the following formula (79):

(79)

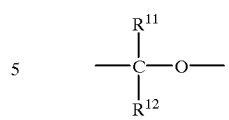

wherein $R^{11}$ and $R^{12}$ are independently a hydrogen atom or an alkyl group having at most 12 carbon atoms.

When alkyl groups are selected as the above respective substituents, a methyl group is particularly preferred from the viewpoint of easy synthesis.

Among the above-described compounds, those represented by the formulae (40) to (45), (48), (52), (58), (65), (71), (72) and (76) are preferred.

The compounds (C) having a group containing a substituted allyloxy group used in the present invention may be used either singly or in any combination thereof. The proportion of these compounds to be incorporated is generally 2 parts by weight, preferably 8 parts by weight in terms of the lower limit per 100 parts by weight of the resin binder (A), and generally 100 parts by weight, preferably 80 parts by weight in terms of the upper limit. Proportions lower than 2 parts by weight result in a resist composition which may become impossible to form any pattern in some cases. On the other hand, proportions exceeding 100 parts by weight result in a resist composition attended by evils such as deteriorated film-forming property. Such a low or high proportion is hence not preferable.

In the resist composition of the present invention comprising the components (A), (B) and (C), proportions of the components (B) and (C) are 0.01–60 parts by weight, preferably 0.2–30 parts by weight, and 2–100 parts by weight, preferably 8–80 parts by weight, respectively, per 100 parts by weight of the component (A). If the proportion of the component (C) is too low, the resulting resist composition becomes impossible to form any pattern. If the proportion is too high on the other hand, the resulting resist composition undergoes partial insolubilization upon development, and the form of a pattern formed therefrom is deteriorated.

The compound (C) cleavable by an acid is cleaved at its substituted allyloxy group moiety in the presence of an acid derived from the compound (B) which can form an acid upon exposure to active rays, and serves to make the resin binder (A) alkali-soluble or enhance the solubility of the resin binder in alkali.

The resist composition comprising the components (A) to (C) is evenly dissolved in an organic solvent to use it. The solvent, other additives, developing method and the like are the same as described above.

EXAMPLES

The present invention will hereinafter be described more specifically by Examples. Incidentally, all designations of "part" or "parts" and "%" as will be used in the following examples mean part or parts by weight and wt. % unless expressly noted.

Referential Example 1

Synthesis of 3-methyl-2-butenyl bromoacetate

A 1-liter flask was charged with 43.9 g (0.51 mol) of 3-methyl-2-buten-1-ol, 51.6 g (0.51 mol) of triethylamine and 300 ml of dichloromethane, and the mixture was cooled down to 0° C. While stirring the mixture at 0° C., 100.9 g (0.50 mol) of bromoacetyl bromide were added dropwise over 1 hour, followed by stirring further for 3 hours at room temperature. Solids were separated by filtration from the resultant reaction mixture, and the filtrate was washed 3 times with water and distilled to obtain 66.5 g of 3-methyl-2-butenyl bromoacetate.

Referential Example 2

Synthesis of 1-methyl-2-butenyl bromoacetate

1-Methyl-2-butenyl bromoacetate was obtained in an amount of 48.5 g in the same manner as in Referential Example 1 except that 43.9 g (0.51 mol) of 3-penten-2-ol were used in place of 3-methyl-2-buten-1-ol.

Referential Example 3

Synthesis of 1,1-dimethyl-2-propenyl bromoacetate 1,1-Dimethyl-2-propenyl bromoacetate was obtained in an amount of 25.4 g in the same manner as in Referential Example 1 except that 43.9 g (0.51 mol) of 2-methyl-3-buten-2-ol were used in place of 3-methyl-2-buten-1-ol.

Referential Example 4

Synthesis of 2-cyclohexenyl bromoacetate

2-Cyclohexenyl bromoacetate was obtained in an amount of 50.4 g in the same manner as in Referential Example 1 except that 50.0 g (0.51 mol) of 2-cyclohexen-1-ol were used in place of 3-methyl-2-buten-1-ol.

Referential Example 5

Synthesis of 3-methyl-2-butenyl 4-(bromomethyl) phenoxyacetate

A 500-ml flask was charged with 20.7 g (0.10 mol) of 3-methyl-2-butenyl bromoacetate obtained in Referential Example 1, 12.4 g (0.10 mol) of 4-hydroxybenzylalcohol, 15.2 g (0.11 mol) of anhydrous potassium carbonate, 18.3 g (0.11 mol) of potassium iodide and 150 ml of acetone, and the mixture was refluxed for 7 hours with stirring. Solids were separated by filtration from the resultant reaction mixture, and the filtrate was washed 3 times with water and then concentrated, thereby obtaining 24.0 g of 3-methyl-2-butenyl 4-(hydroxymethyl)phenoxyacetate. A 500-ml flask was then charged with 24.0 g (0.096 mol) of the acetate thus obtained, 20.6 g (0.20 mol) of sodium bromide, 9.4 g (0.12 mol) of pyridine and 150 ml of dimethylformamide, and the mixture was cooled down to 0° C. While stirring the mixture at 0° C., 13.7 g (0.12 mol) of mesyl chloride were added dropwise over 1 hour, followed by stirring further for 6 hours. Solids were separated by filtration from the resultant reaction mixture, and the filtrate was washed 3 times with water, concentrated and then subjected to column chromatography (eluting solvent: n-hexane/ethyl acetate=10/1), thereby obtaining 11.8 g of 3-methyl-2-butenyl 4-(bromomethyl)phenoxyacetate.

Referential Example 6

Synthesis of 1,1-dimethyl-2-propenyl (4-bromomethyl)phenoxyacetate 1,1-Dimethyl-2-propenyl (4-bromomethyl) phenoxyacetate was obtained in an amount of 10.9 g in the same manner as in Referential Example 5 except that 20.7 g (0.10 mol) of 1,1-dimethyl-2-propenyl bromoacetate obtained in Referential Example 3 were used in place of the ester obtained in Referential Example 1.

Referential Example 7

Synthesis of 3-methyl-2-butenyl chlorooxalate

A 1-liter eggplant type flask was charged with 25.4 g (0.20 mol) of oxalyl chloride and 250 ml of n-heptane, to which 21.5 (0.25 mol) of 3-methyl-2-buten-1-ol were added dropwise over 3 hours while bubbling nitrogen at room temperature, followed by stirring further for 2 hours. Thereafter, the reaction mixture was concentrated and distilled to obtain 11.6 g of 3-methyl-2-butenyl chlorooxalate.

Referential Example 8

Synthesis of 2-butenyl bromoacetate

2-Butenyl bromoacetate was obtained in an amount of 50.2 g in the same manner as in Referential Example 1 except that 36.8 g (0.51 mol) of 2-buten-1-ol were used in place of 3-methyl-2-buten-1-ol.

Referential Example 9

Synthesis of 1-methyl-2-propenyl bromoacetate

1-Methyl-2-propenyl bromoacetate was obtained in an amount of 27.2 g in the same manner as in Referential Example 1 except that 36.8 g (0.51 mol) of 3-buten-2-ol were used in place of 3-methyl-2-buten-1-ol.

Referential Example 10

Synthesis of 3-methyl-2-butenyloxycarbonylmethylated, hydrogenated polyhydroxystyrene A 500-ml flask was charged with 12.0 g of 10% hydrogenated polyhydroxystyrene (Mw=4,900) and 100 ml of DMF to prepare a solution. To the solution, were added 4.1 g (0.02 mol) of 3-methyl-2-butenyl bromoacetate, 6.9 g (0.05 mol) of anhydrous potassium carbonate and 8.3 g (0.05 mol) of potassium iodide, and the mixture was stirred for 100 hours at 50 in a nitrogen gas stream. Thereafter, the reaction mixture was cooled, and salts formed were removed by filtration, and the filtrate was then poured into water to recover precipitate deposited. This precipitate was washed each 3 times with 0.1% hydrochloric acid and water and dried, thereby obtaining 13.7 g of a polymer, 3-methyl-2-butenyloxycarbonylmethylated, hydrogenated polyhydroxystyrene. The GPC analysis of the polymer thus obtained revealed that its Mw was 5,640. Besides, the $^1$H-NMR spectrum analysis of the polymer revealed that the percent modification of the hydroxyl group was 15%.

Referential Example 11

Synthesis of 4-hydroxystyrene/t-butyl methacrylate copolymer

A 500-ml flask was charged with 72.1 g (0.60 mol) of 4-hydroxystyrene, 17.1 g (0.12 mol) of t-butyl methacrylate, 1.5 g (0.009 mol) of azobisisobutyronitrile and 150 ml of dioxane, and the mixture was stirred for 100 hours at 80t in a nitrogen gas stream. The resultant reaction mixture was poured into 5 liters of xylene, and precipitate formed was collected by filtration. The resultant precipitate was dissolved in 200 ml of diethyl ether, and the solution was poured into 3 liters of n-hexane to collect precipitate formed by filtration (reprecipitation process). This reprecipitation process was repeated 3 times, and the resultant precipitate was dried to obtain 26.3 g of a 4-hydroxystyrene/t-butyl methacrylate copolymer. The GPC analysis of the polymer thus obtained revealed that its Mw was 6,410. Besides, the $^1$H-NMR spectrum analysis of the polymer revealed that the copolymerization ratio of 4-hydroxystyrene to t-butyl methacrylate was 71/29.

Synthesis Example 1

Synthesis of 3-methyl-2-butenyloxycarbonylmethylated, hydrogenated polyvinylphenol A 500-ml flask was charged with 12.0 g of 10% hydrogenated polyvinylphenol (Mw=4,950) and 100 ml of dimethylformamide to prepare a solution. To the solution, were added 6.2 g (0.03 mol) of 3-methyl-2-butenyl bromoacetate obtained in Referential Example 1, 6.9 g (0.05 mol) of anhydrous potassium carbonate and 8.3 g (0.05 mol) of potassium iodide, and the mixture was stirred for 8 hours at 50%. Thereafter, the reaction mixture was cooled and poured into water, and precipitate deposited was collected by filtration. This precipitate was washed each 3 times with 0.1% hydrochloric acid and water and dried, thereby obtaining 13.1 g of 3-methyl-2-butenyloxycarbonylmethylated, hydrogenated polyvinylphenol. The GPC analysis of the resin thus obtained revealed that its Mw was 6,310. Besides, the $^1$H-NMR spectrum analysis of the resin revealed that the percent modification of the hydroxyl group was 26%.

Synthesis Example 2

Synthesis of 1-methyl-2-butenyloxycarbonylmethylated, hydrogenated polyvinylphenol 1-Methyl-2-butenyloxycarbonylmethylated, hydrogenated polyvinylphenol was obtained in an amount of 11.8 g in the same manner as in Synthesis Example 1 except that 6.2 g (0.03 mol) of 1-methyl-2-butenyl bromoacetate obtained in Referential Example 2 were used in place of the ester obtained in Referential Example 1. The GPC analysis of the resin thus obtained revealed that its Mw was 6,270. Besides, the $^1$H-NMR spectrum analysis of the resin revealed that the percent modification of the hydroxyl group was 25%.

Synthesis Example 3

Synthesis of 1,1-dimethyl-2-propenyloxycarbonylated, hydrogenated polyvinylphenol 1,1-Dimethyl-2-propenyloxycarbonylated, hydrogenated polyvinylphenol was obtained in an amount of 12.2 g in the same manner as in Synthesis Example 1 except that 6.2 g (0.03 mol) of 1,1-dimethyl-2-propenyl bromoacetate obtained in Referential Example 2 were used in place of the ester obtained in Referential Example 1. The GPC analysis of the resin thus obtained revealed that its Mw was 6,290. Besides, the $^1$H-NMR spectrum analysis of the resin revealed that the percent modification of the hydroxyl group was 26%.

Synthesis Example 4

Synthesis of 2-cyclohexenyloxycarbonylmethylated, hydrogenated polyvinylphenol

2-Cyclohexenyloxycarbonylmethylated, hydrogenated polyvinylphenol was obtained in an amount of 10.9 g in the same manner as in Synthesis Example 1 except that 6.6 g (0.03 mol) of 2-cyclohexenyl bromoacetate obtained in Referential Example 4 were used in place of the ester obtained in Referential Example 1. The GPC analysis of the resin thus obtained revealed that its Mw was 7,510. Besides, the $^1$H-NMR spectrum analysis of the resin revealed that the percent modification of the hydroxyl group was 25%.

Synthesis Example 5

Synthesis of 4-(3-methyl-2-butenyloxycarbonylmethyloxy)benzylated, hydrogenated polyvinylphenol 4-(3-Methyl-2-butenyloxycarbonylmethyloxy)benzylated, hydrogenated polyvinylphenol was obtained in an amount of 17.4 g in the same manner as in Synthesis Example 1 except that 9.4 g (0.03 mol) of 2-methyl-2-butenyl 4-(bromomethyl)phenoxyacetate obtained in Referential Example 5 were used in place of the ester obtained in Referential Example 1. The GPC analysis of the resin thus obtained revealed that its Mw was 7,510. Besides, the $^1$H-NMR spectrum analysis of the resin revealed that the percent modification of the hydroxyl group was 25%.

Synthesis Example 6

Synthesis of 4-(1,1-dimethyl-2-propenyloxycarbonylmethyloxy)benzylated, hydrogenated polyvinylphenol 4-(1,1-Dimethyl-2-propenyloxycarbonylmethyloxy)benzylated, hydrogenated polyvinylphenol was obtained in an amount of 17.2 g in the same manner as in Synthesis Example 1 except that 9.4 g (0.03 mol) of 1,1-dimethyl-2-propenyl 4-(bromomethyl)phenoxyacetate obtained in Referential Example 6 were used in place of the ester obtained in Referential Example 1. The GPC analysis of the resin thus obtained revealed that its Mw was 7,420. Besides, the $^1$H-NMR spectrum analysis of the resin revealed that the percent modification of the hydroxyl group was 24%.

Synthesis Example 7

Synthesis of 3-methyl-2-butenyloxycarbonylmethylated, hydrogenated polyvinylphenol 3-Methyl-2-butenyloxycarbonylmethylated, hydrogenated polyvinylphenol was obtained in an amount of 12.1 g in the same manner as in Synthesis Example 1 except that 12.0 g of polyvinylphenol (Mw=4,800) were used in place of 10% hydrogenated polyvinylphenol. The GPC analysis of the resin thus obtained revealed that its Mw was 6,220. Besides, the $^1$H-NMR spectrum analysis of the resin revealed that the percent modification of the hydroxyl group was 28%.

Synthesis Example 8

Synthesis of 3-methyl-2-butenyloxycarbonylcarbonylated polyvinylphenol

After a 300-ml eggplant type flask was charged with 12.0 g of polyvinylphenol (Mw=4,800) and 100 ml of THF to prepare a solution, 10.1 g (0.1 mol) of triethylamine were added to the solution. While cooling this solution down to 0° C. and stirring, 12.4 g (0.07 mol) of 3-methyl-2-butenyl chlorooxalate obtained in Referential Example 7 were added dropwise over 1 hour, followed by stirring for 3 hours at 0°

C. After completion of the reaction, deposit in the reaction mixture was removed by filtration, and the filtrate was poured into a 3% aqueous solution of sodium hydrogencarbonate, and precipitate formed was separated by filtration. This precipitate was washed each 3 times with 0.1% hydrochloric acid and water and dried under reduced pressure, thereby obtaining 15.9 g of 3-methyl-2-butenyloxycarbonylcarbonylated polyvinylphenol. The GPC analysis of the resin thus obtained revealed that its Mw was 6,420. Besides, the $^1$H-NMR spectrum analysis of the resin revealed that the percent modification of the hydroxyl group was 31%.

Synthesis Example 9

Synthesis of 3-methyl-2-butenyloxycarbonylated polyvinylphenol

After a 500-ml eggplant type flask was charged with 12.0 g of polyvinylphenol (Mw=4,800) and 200 ml of THF to prepare a solution, 9.1 g (0.09 mol) of triethylamine were added to refrigerate the mixture down to −30° C. To this mixture, 7.4 g (0.05 mol) of 3-methyl-2-butenyl chloroformate were added dropwise over 1 hour at −30° C. After the addition, the resultant mixture was stirred further for 5 hours at −30° C. Thereafter, the reaction mixture was poured into a 3% aqueous solution of sodium hydrogencarbonate, and precipitate formed was separated by filtration. This precipitate was washed each 3 times with 0.1% hydrochloric acid and water and dried, thereby obtaining 13.8 g of 3-methyl-2-butenyloxycarbonylated polyvinylphenol. The GPC analysis of the resin thus obtained revealed that its Mw was 6,090. Besides, the $^1$H-NMR spectrum analysis of the resin revealed that the percent modification of the hydroxyl group was 29%.

Synthesis Example 10

Synthesis of 3-methyl-2-butenylated polyvinylphenol

A 300-ml eggplant type flask was charged with 12.0 g of polyvinylphenol (Mw=4,800) and 100 ml of acetone to prepare a solution. After the preparation of the solution, 11.9 g (0.08 mol) of 1-bromo-3-methyl-2-butene (product of Tokyo Kasei Kogyo Co., Ltd.), 15.2 g (0.11 mol) of anhydrous potassium carbonate and 18.3 g (0.11 mol) of potassium iodide were added, and the mixture was refluxed for 6 hours. After cooling the reaction mixture, salts formed were removed by filtration, and the filtrate was poured into 5 liters of water. Precipitate formed was separated by filtration and dried, thereby obtaining 13.7 g of 3-methyl-2-butenylated polyvinylphenol. The GPC analysis of the resin thus obtained revealed that its Mw was 5,660. Besides, the $^1$H-NMR spectrum analysis of the resin revealed that the percent modification of the hydroxyl group was 32%.

Synthesis Example 11

Synthesis of 2-butenyloxycarbonylmethylated polyvinylphenol

2-Butenyloxycarbonylmethylated polyvinylphenol was obtained in an amount of 12.8 g in the same manner as in Synthesis Example 1 except that 5.8 g (0.03 mol) of 2-butenyl bromoacetate obtained in Referential Example 8 were used in place of the ester obtained in Referential Example 1. The GPC analysis of the resin thus obtained revealed that its Mw was 6,250. Besides, the $^1$H-NMR spectrum analysis of the resin revealed that the percent modification of the hydroxyl group was 28%.

Synthesis Example 12

Synthesis of 1-methyl-2-propenyloxycarbonylmethylated polyvinylphenol

1-Methyl-2-propenyloxycarbonylmethylated polyvinylphenol was obtained in an amount of 12.5 g in the same manner as in Synthesis Example 1 except that 5.8 g (0.03 mol) of 1-methyl-2-propenyl bromoacetate obtained in Referential Example 9 were used in place of the ester obtained in Referential Example 1. The GPC analysis of the resin thus obtained revealed that its Mw was 6,200. Besides, the $^1$H-NMR spectrum analysis of the resin revealed that the percent modification of the hydroxyl group was 27%.

Synthesis Example 13

Synthesis of 2-propenylated polyvinylphenol

2-Propenylated polyvinylphenol was obtained in an amount of 13.1 g in the same manner as in Synthesis Example 10 except that 9.7 g (0.08 mol) of allyl bromide were used in place of 1-bromo-3-methyl-2-butene. The GPC analysis of the resin thus obtained revealed that its Mw was 5,440. Besides, the $^1$H-NMR spectrum analysis of the resin revealed that the percent modification of the hydroxyl group was 36%.

Synthesis Example 14

Synthesis of 4-hydroxystyrene/3-methyl-2-butenyl methacrylate copolymer

A 1-liter flask was charged with 72.1 g (0.60 mol) of 4-hydroxystyrene, 49.2 g (0.60 mol) of 2-methyl-2-butenyl methacrylate, 1.5 g (0.009 mol) of azobisisobutyronitrile and 300 ml of dioxane, and the mixture was stirred for 20 hours at 20° C. in a nitrogen gas stream. The resultant reaction mixture was poured into 5 liters of xylene, and precipitate formed was collected by filtration. The resultant solids were dissolved in 300 ml of acetone, and the solution was poured into 4 liters of n-hexane to collect precipitate formed by filtration (reprecipitation process). This reprecipitation process was repeated 3 times, and the resultant precipitate was then dried to obtain 103.5 g of a 4-hydroxystyrene/3-methyl-2-butenyl methacrylate copolymer. The GPC analysis of the copolymer thus obtained revealed that its Mw was 8,800. Besides, the $^1$H-NMR spectrum analysis of the polymer revealed that the copolymerization ratio of 4-hydroxystyrene to 3-methyl-2-butenyl methacrylate was 53/47.

Examples 1–13, Comparative Examples 1–3

Dissolved in 440 parts of ethyl lactate were 100 parts of each of the respective resins obtained in Synthesis Examples 1–13 (systems in which the resins of Synthesis Examples 1–10 were separately used are Examples 1–10, respectively, while systems in which the resins of Synthesis Examples 11–13 were separately used are Comparative Examples 1–3, respectively), 5 parts of triphenylsulfonium triflate as a photo-induced acid generator and 0.01 part of a fluorine-containing surfactant. The solution was filtered through a polytetrafluoroethylene filter (product of Nihon Millipore Ltd.) having a pore size of 0.1 µm to prepare a resist solution.

After applying the resist solution on a silicon wafer by a spinner, the resist solution was baked for 90 seconds at 90°

C., thereby forming a resist film having a thickness of 1.0 µm. The silicon wafer on which the resist film had been formed was exposed by means of an excimer stepper (NA= 0.45) and a test reticle.

Thereafter, the silicon wafer on which the resist solution containing each of the resins of Synthesis Examples 11–13 had been coated was baked for 60 seconds at 110° C., while the silicon wafer making use of the resist solution containing each of the resins of Synthesis Examples 1–10 was baked for 60 seconds at 90° C. Each of the thus-baked wafers was then developed by immersion developing in an aqueous solution of tetramethylammonium hydroxide for 1 minute, thereby obtaining a positive pattern.

The sensitivity and resolution of the resist films thus obtained were as shown in Table 1.

TABLE 1

|  | Resin | Sensitivity (*1) | Resolution (*2) |
|---|---|---|---|
| Example | 1 3-Methyl-2-butenyloxcarbonylmethylated, hydrogenated polyvinylphenyl | 12 | 0.250 |
|  | 2 1-Methyl-2-butenyloxycarbonylmethylated, hydrogenated polyvinylphenol | 29 | 0.275 |
|  | 3 1,1-Dimethyl-2-propenyloxycarbonylmethylated, hydrogenated polyvinylphenol | 8 | 0.250 |
|  | 4 2-Cyclohexenyloxycarbonylmethylated, hydrogenated polyvinylphenol | 38 | 0.325 |
|  | 5 4-(3-Methyl-2-butenyloxycarbonyloxy)-methylated, hydrogenated polyvinylphenol | 32 | 0.275 |
|  | 6 4-(1,1-Dimethyl-2-propenyloxy-carbonylmethoxy)benzylated, hydrogenated polyvinylphenol | 28 | 0.275 |
|  | 7 3-Methyl-2-butenyloxycarbonylmethylated polyvinylphenol | 10 | 0.250 |
|  | 8 3-Methyl-2-butenyloxycarbonyl-carbonylated polyvinylphenol | 8 | 0.275 |
|  | 9 3-Methyl-2-butenyloxycarbonylated polyvinylphenol | 7 | 0.250 |
|  | 10 3-Methyl-2-butenylated polyvinylphenol | 10 | 0.275 |
| Comp. Example | 1 2-Butenyloxycarbonylmethylated, hydrogenated polyvinyl phenol | 36 | 0.375 |
|  | 2 1-Methyl-2-propenyloxycarbonylmethylated, hydrogenated polyvinylphenol | 20 | 0.375 |
|  | 3 2-Propenylated polyvinylphenol | No pattern was formed | |

(*1) The unit of the sensitivity is mJ/cm$^2$.
(*2) The unit of the resolution is µm.

No pattern was formed in the composition (Comparative Example 3) comprising the resin binder having unsubstituted allyloxy groups, so that it was impossible to use such a composition as a resist.

In particular, the systems (Examples 1–10) in which the number of the substituents in the substituted allyloxy groups of the resin binders is 2 or more exhibit higher sensitivity though their baking temperature is lower (exposure conditions are weaker) than that in the systems (Comparative Examples 1 and 2) in which the number of the substituents is 1. Besides, the systems (Examples 1 and 3) in which no substituent exists at the 1-position, and two substituents exist at the 1-position are superior in sensitivity and resolution to the system (Example 2) in which one substituent exists at the 1-position.

Example 11

A process was conducted in the same manner as in Examples 1–10 except that the 4-hydroxystyrene/3-methyl-2-butenyl methacrylate copolymer obtained in Synthesis Example 14 was used as the resin. As a result, sensitivity and resolution were found to be 8 µJ/cm$^2$ and 0.25 µm, respectively.

The resist compositions used in Examples 3 and 11 were separately used to obtain line & space patterns at intervals of 5 µm. With respect to the respective patterns, a heat resistance test was performed under conditions that UV cure was carried out or not. As a result, the temperatures of heat resistance were as shown in Table 2. Incidentally, the temperature of heat resistance indicates a temperature at which the edge of a pattern starts to be deformed.

Conditions of UV Cure

Low pressure mercury lamp, 500 mW, 90° C./1 min.

Conditions of Heat Resistance Test

Treated for 5 minutes on a hot plate at a preset temperature.

TABLE 2

| Example | Conducting no UV cure | Conducting UV cure |
|---|---|---|
| 3 | 115° C. | At least 180° C. |
| 11 | 125° C. | At least 180° C. |

As described above, it was found that the compositions according to the present invention can achieve excellent performance characteristics as resists.

Further, the resin binders according to the present invention contain carbon-carbon double bonds derived from the substituted allyloxy group serving as an acid-unstable group and hence permit conducting UV cure which has been unable to be conducted in the conventional resin binders containing acid-unstable groups free of any unsaturated bond. As a result, there is also achieved an effect that pattern sag (flow under heat) which may occur upon etching becomes hard to occur.

Synthesis Example 15

Synthesis of 4-(3-methyl-2-butenyloxycarbonylmethyloxy)styrene/4-hydroxystyrene/n-butyl methacrylate copolymer ① Polymerization Process A 500-ml flask was charged with 72.1 g (0.60 mol) of 4-hydroxystyrene, 17.0 g (0.12 mol) of n-butyl methacrylate, 1.5 g (0.009 mol) of azobisisobutyronitrile and 150 ml of dioxane, and the mixture was stirred for 20 hours at 80° C. in a nitrogen gas stream. The resultant reaction mixture was poured into 5 liters of xylene, and precipitate formed was collected by filtration. The resultant solids were dissolved in 200 ml of diethyl ether, and the solution was poured into 3 liters of n-hexane to collect precipitate formed by filtration (reprecipitation process). This reprecipitation process was repeated 3 times, and the resultant precipitate was then dried to obtain 23.6 g of a 4-hydroxystyrene/n-butyl methacrylate copolymer. The GPC analysis of the polymer thus obtained revealed that its Mw was 5,600. Besides, the $^1$H-NMR spectrum analysis of the polymer revealed that the copolymerization ratio of 4-hydroxystyrene to n-butyl methacrylate was 68/32.

② Modification Process

A 500 ml-flask was charged with 23.6 g of the 4-hydroxystyrene/n-butyl methacrylate copolymer previously obtained and 150 ml of acetone to prepare a solution. To the solution, were added 7.7 g (0.037 mol) of 3-methyl-2-butenyl bromoacetate obtained in Referential Example 1, 6.9 g (0.05 mol) of anhydrous potassium carbonate and 8.3 g (0.05 mol) of potassium iodide, and the mixture was stirred for 8 hours at 50° C. After solids were removed from the resultant reaction mixture, the residue was poured into 5 liters of n-hexane, and precipitate formed was collected by filtration. The resultant solids were dissolved in 100 ml of diethyl ether, and the solution was poured into 5 liters of hexane to collect precipitate formed by filtration (reprecipitation process). This reprecipitation process was repeated twice, and the resultant precipitate was then dried to obtain 28.3 g of a 4-(3-methyl-2-butenyloxycarbonylmethyloxy)styrene/4-hydroxystyrene/n-butyl methacrylate copolymer. The GPC analysis of the copolymer thus obtained revealed that its Mw was 5,660. Besides, the $^1$H-NMR spectrum analysis of the resin revealed that the copolymerization ratio of 4-(3-methyl-2-butenyloxycarbonylmethyloxy)styrene to 4-hydroxystyrene to n-butyl methacrylate was 23/49/28.

Synthesis Example 16

Synthesis of 4-(3-methyl-2-butenyloxycarbonylmethyloxy)styrene/4-hydroxystyrene/ethyl methacrylate copolymer ① Polymerization Process A process was conducted in the same manner as in Synthesis Example 15, Process ① except that 13.7 g (0.12 mol) of ethyl methacrylate were used, thereby obtaining 21.9 g of a 4-hydroxystyrene/ethyl methacrylate copolymer. The GPC analysis of the polymer thus obtained revealed that its Mw was 6,150. Besides, the $^1$H-NMR spectrum analysis of the polymer revealed that the copolymerization ratio of 4-hydroxystyrene to ethyl methacrylate was 71/29.

② Modification Process

A process and drying were conducted in the same manner as in Synthesis Example 15, Process ② except that 21.9 g of the 4-hydroxystyrene/ethyl methacrylate copolymer previously obtained were used, thereby obtaining 26.4 g of a 4-(3-methyl-2-butenyloxycarbonylmethyloxy)styrene/4-hydroxystyrene/ethyl methacrylate copolymer. The GPC analysis of the copolymer thus obtained revealed that its Mw was 6,150. Besides, the $^1$H-NMR spectrum analysis of the resin revealed that the copolymerization ratio of 4-(3-methyl-2-butenyloxycarbonylmethyloxy)styrene to 4-hydroxystyrene to ethyl methacrylate was 20/51/29.

Synthesis Example 17

Synthesis of 4-(3-methyl-2-butenyloxycarbonylmethyloxy)styrene/4-hydroxystyrene/2-hydroxyethyl methacrylate copolymer ① Polymerization Process A process was conducted in the same manner as in Synthesis Example 15, Process ① except that 15.6 g (0.12 mol) of 2-hydroxyethyl methacrylate were used, thereby obtaining 22.2 g of a 4-hydroxystyrene/2-hydroxyethyl methacrylate copolymer. The GPC analysis of the polymer thus obtained revealed that its Mw was 6,300. Besides, the $^1$H-NMR spectrum analysis of the polymer revealed that the copolymerization ratio of 4-hydroxy-styrene to 2-hydroxyethyl methacrylate was 74/26.

② Modification Process

A process and drying were conducted in the same manner as in Synthesis Example 15, Process ② except that 22.2 g of the 4-hydroxystyrene/2-hydroxyethyl methacrylate copolymer previously obtained were used, thereby obtaining 26.5 g of a 4-(3-methyl-2-butenyloxycarbonylmethyloxy) styrene/4-hydroxystyrene/2-hydroxyethyl methacrylate. The GPC analysis of the copolymer thus obtained revealed that its Mw was 6,350. Besides, the $^1$H-NMR spectrum analysis of the resin revealed that the copolymerization ratio of 4-(3-methyl-2-butenyloxycarbonylmethyloxy)styrene to 4-hydroxystyrene to 2-hydroxyethyl methacrylate was 23/52/25.

Synthesis Example 18

Synthesis of 4-(3-methyl-2-butenyloxycarbonylmethyloxy)styrene/4-hydroxystyrene/1-methylcyclohexyl methacrylate copolymer ① Polymerization Process A process was conducted in the same manner as in Synthesis Example 15, Process i except that 21.8 g (0.12 mol) of 1-methylcyclohexyl methacrylate were used, thereby obtaining 25.9 g of a 4-hydroxystyrene/1-methylcyclohexyl methacrylate copolymer. The GPC analysis of the polymer thus obtained revealed that its Mw was 6,450. Besides, the $^1$H-NMR spectrum analysis of the polymer revealed that the copolymerization ratio of 4-hydroxystyrene to 1-methylcyclohexyl methacrylate was 77/23.

② Modification Process

A process and drying were conducted in the same manner as in Synthesis Example 15, Process ② except that 25.9 g of the 4-hydroxystyrene/1-methylcyclohexyl methacrylate copolymer previously obtained were used, thereby obtaining 30.1 g of a 4-(3-methyl-2-butenyloxycarbonylmethyloxy) styrene/4-hydroxystyrene/1-methylcyclohexyl methacrylate copolymer. The GPC analysis of the copolymer thus obtained revealed that its Mw was 6,450. Besides, the $^1$H-NMR spectrum analysis of the resin revealed that the copolymerization ratio of 4-(3-methyl-2-butenyloxycarbonylmethyloxy)styrene to 4-hydroxystyrene to 1-methylcyclohexyl methacrylate was 23/52/25.

Synthesis Example 19

Synthesis of 4-(1-methyl-2-butenyloxycarbonylmethyloxy)styrene/4-hydroxystyrene/n-butyl methacrylate copolymer A process and drying were conducted in the same manner as in Synthesis Example 15, Process ② except that a 4-hydroxystyrene/n-butyl methacrylate copolymer obtained in accordance with the same process as in Synthesis Example 15, Process ① was used, thereby obtaining 28.0 g of a 4-(1-methyl-2-butenyloxycarbonylmethyloxy)styrene/ 4-hydroxystyrene/n-butyl methacrylate copolymer. The GPC analysis of the copolymer thus obtained revealed that its Mw was 5,800. Besides, the $^1$H-NMR spectrum analysis of the resin revealed that the copolymerization ratio of 4-(1-methyl-2-butenyloxycarbonylmethyloxy)styrene to 4-hydroxystyrene to n-butyl methacrylate was 25/47/28.

Synthesis Example 20

Synthesis of 4-(1-methyl-2-butenyloxycarbonylmethyloxy)styrene/4-hydroxystyrene/ethyl methacrylate copolymer A process and drying were conducted in the same manner as in Synthesis Example 16, Process ② except that a 4-hydroxystyrene/ethyl methacrylate copolymer obtained in accordance with the same process as in Synthesis Example 16, Process ① was used, thereby obtaining 26.2 g of a 4-(1-methyl-2-butenyloxycarbonylmethyloxy)styrene/4-hydroxystyrene/ethyl methacrylate copolymer. The GPC analysis of the copolymer thus obtained revealed that its Mw was 6,160. Besides, the $^1$H-NMR spectrum analysis of the resin revealed that the copolymerization ratio of 4-(1-methyl-2-butenyloxycarbonylmethyloxy)-styrene to 4-hydroxystyrene to ethyl methacrylate was 29/44/27.

Synthesis Example 21

Synthesis of 4-(1-methyl-2-butenyloxycarbonylmethyloxy)styrene/4-hydroxystyrene/2-hydroxyethyl methacrylate copolymer A process and drying were conducted in the same manner as in Synthesis Example 17, Process ② except that a 4-hydroxystyrene/2-hydroxyethyl methacrylate copolymer obtained in accordance with the same process as in Synthesis Example 17, Process ① was used, thereby obtaining 25.8 g of a 4-(1-methyl-2-butenyloxycarbonylmethyloxy)styrene/4-hydroxystyrene/2-hydroxyethyl methacrylate copolymer. The GPC analysis of the copolymer thus obtained revealed that its Mw was 6,250. Besides, the $^1$H-NMR spectrum analysis of the resin revealed that the copolymerization ratio of 4-(1-methyl-2-butenyloxycarbonylmethyloxy)styrene to 4-hydroxystyrene to 2-hydroxyethyl methacrylate was 25/46/29.

Synthesis Example 22

Synthesis of 4-(1-methyl-2-butenyloxycarbonylmethyloxy)styrene/4-hydroxystyrene/1-methylcyclohexyl methacrylate copolymer A process and drying were conducted in the same manner as in Synthesis Example 18, Process ② except that a 4-hydroxystyrene/1-methylcyclohexyl methacrylate copolymer obtained in accordance with the same process as in Synthesis Example 18, Process ① was used, thereby obtaining 29.8 g of a 4-(1-methyl-2-butenyloxycarbonylmethyloxy)styrene/4-hydroxystyrene/1-methylcyclohexyl methacrylate copolymer. The GPC analysis of the copolymer thus obtained revealed that its Mw was 6,350. Besides, the $^1$H-NMR spectrum analysis of the resin revealed that the copolymerization ratio of 4-(1-methyl-2-butenyloxycarbonylmethyloxy)styrene to 4-hydroxystyrene to 1-methylcyclohexyl methacrylate was 24/50/26.

Examples 12–19, Comparative Example 4

Dissolved in 440 parts of ethyl lactate were 100 parts of each of the respective resins obtained in Synthesis Examples 15-22 and t-butyl acetate-modified poly(4-vinylphenol) (weight average molecular weight (Mw)=6,000 as measured by GPC analysis) prepared as a comparative example in accordance with the process described in Japanese Patent Application Laid-Open No. 249673/1993, 5 parts of triphenylsulfonium triflate as a photo-induced acid generator and 0.01 part of a fluorine-containing surfactant. The solution was filtered through a polytetrafluoroethylene filter (product of Nihon Millipore Ltd.) having a pore size of 0.1 μm to prepare a resist solution.

After applying the resist solution on a silicon wafer by a spinner, the resist solution was baked for 90 seconds at 90° C., thereby forming a resist film having a thickness of 1.0 μm. The silicon wafer on which the resist film had been formed was exposed by means of a KrF excimer stepper (NA=0.45) and a test reticle. Thereafter, the silicon wafer on which the resist solution had been coated was baked for 60 seconds at 90° C. and then developed by immersion developing in an aqueous solution of tetramethylammonium hydroxide for 1 minute, thereby obtaining a positive pattern. The results are shown in Table 3.

TABLE 3

| | | Structure of resin (*1) | | | | | | |
|---|---|---|---|---|---|---|---|---|
| | | Formula (16) $R_4$ | Formula (18) $R_5$ | Mw | k/m/n | Sensitivity (*2) | Resolution (*3) | Pattern form (*4) |
| Example | 12 | 3-Methyl-2-butenyl-oxycarbonylmethyl-oxy | n-Butyl | 5,660 | 23/49/28 | 12 | 0.250 | Good |
| | 13 | | Ethyl | 6,150 | 20/51/29 | 11 | 0.250 | Good |
| | 14 | | 2-Hydroxyethyl | 6,350 | 23/52/25 | 15 | 0.275 | Good |
| | 15 | | 1-Methylcyclohexyl | 6,450 | 23/52/25 | 16 | 0.250 | Good |
| | 16 | 1-Methyl-2-butenyl-oxycarbonylmethyl-oxy | n-Butyl | 5,800 | 25/47/28 | 10 | 0.250 | Good |
| | 17 | | Ethyl | 6,150 | 29/44/27 | 11 | 0.275 | Good |
| | 18 | | 2-Hydroxyethyl | 6,250 | 25/46/29 | 14 | 0.275 | Good |
| | 19 | | 1-Methylcyclohexyl | 6,350 | 23/50/26 | 15 | 0.275 | Good |
| comp. Ex. | 4 | — | — | 6,000 | — | 18 | 0.325 | Poor |

(*1) In common to all the resins of Examples 12–19, $R_1$ and $R_2$ in the formulae (16) and (17) are hydrogen atoms, and $R_3$ in the formula (18) is a methyl group. The resin of the comparative Example is t-butyl acetate-modified poly(4-vinylphenol).
(*2) The unit of the sensitivity is mJ/cm$^2$.
(*3) The unit of the resolution is μm.
(*4) The pattern form was reguarded as "good" where the side wall was perpendicular, and the bottom is clear, or "poor" where the top was in the shape of T in section, the side wall was not perpendicular, and many insolubilized portions were recognized at the bottom upon development.

It was found from the above results that the use of the resins according to the present invention can achieve ideal sensitivity, high resolution and good pattern form. Besides, the resins according to the present invention contain carbon-carbon double bonds derived from the substituted allyloxy group represented by the formula (16) and hence permit conducting UV cure which has been unable to be conducted in the conventional resins containing acid-unstable groups free of any unsaturated bond. As a result, it was also found that such resins have an effect (high etching resistance and heat resistance) that pattern sag under heat, which may occur upon etching, becomes hard to occur.

Synthesis Example 23

Synthesis of bisphenol A bis(3-methyl-2-butenyl) ether

After a 300-ml flask was charged with 17.9 g (0.12 mol) of 1-bromo-3-methyl-2-butene and 11.4 g (0.05 mol) of bisphenol A to dissolve them in 100 ml of DMS, 16.6 g (0.12 mol) of anhydrous potassium carbonate and 19.9 g (0.12 mol) of potassium iodide were added, and the mixture was stirred for 10 hours at 40° C. Thereafter, the reaction mixture was cooled, and salts formed were removed by filtration, and the filtrate was concentrated. The resultant crude product was dissolved in 100 ml of dichloromethane, and the solution was washed each 3 times with a 5% aqueous solution of potassium hydroxide and saturated saline and dried over magnesium sulfate. The solvent was then distilled off to obtain 14.7 g of bisphenol A bis(3-methyl-2-butenyl) ether [the formula (70)].

Synthesis Example 24

Synthesis of O,O'-bis(3-methyl-2-butenylated) bis (4-hydroxyphenyl)sulfone

O,O'-Bis(3-methyl-2-butenylated) bis(4-hydroxyphenyl)sulfone [the formula (71)] was obtained in an amount of 15.8 g in the same manner as in Synthesis Example 23 except that 12.5 g (0.05 mol) of bis(4-hydroxyphenyl)sulfone were used in place of bisphenol A.

Synthesis Example 25

Synthesis of hydroquinone bis(3-methyl-2-butenyl) ether

Hydroquinone bis(3-methyl-2-butenyl) ether [the formula (71)] was obtained in an amount of 10.0 g in the same manner as in Synthesis Example 23 except that 5.5 g (0.05 mol) of hydroquinone were used in place of bisphenol A.

Synthesis Example 26

Synthesis of O,O-bis(2-butenyloxycarbonylmethyl) bisphenol A

After 17.4 g (0.09 mol) of the bromoester obtained in Referential Example 8 and 11.4 g (0.05 mol) of bisphenol A were dissolved in 100 ml of DMF, 16.6 g (0.12 mol) of anhydrous potassium carbonate and 19.9 g (0.12 mol) of potassium iodide were further added, and the mixture was stirred for 10 hours at 50° C. Thereafter, the reaction mixture was cooled, and salts formed were removed by filtration, and the filtrate was concentrated. The resultant crude product was dissolved in 50 ml of dichloromethane, and the solution was washed each 3 times with a 5% aqueous solution of potassium hydroxide and saturated saline and dried over magnesium sulfate. The solvent was then distilled off to obtain 18.1 g of O,O'-bis(2-butenyloxycarbonylmethyl) bisphenol A [the formula (46)].

Synthesis Example 27

Synthesis of O,O'-bis(1-methyl-2-propenyloxycarbonylmethyl)bisphenol A

O,O'-Bis(1-methyl-2-propenyloxycarbonylmethyl) bisphenol A [the formula (42)] was obtained in an amount of 18.3 g in the same manner as in Synthesis Example 25 except that 17.4 g (0.09 mol) of the bromoester obtained in Referential Example 9 were used in place of the bromoester obtained in Referential Example 8.

Synthesis Example 28

Synthesis of O,O'-bis(3-methyl-2-butenyloxycarbonylmethyl)bisphenol A

O,O'-Bis(3-methyl-2-butenyloxycarbonylmethyl) bisphenol A [the formula (40)] was obtained in an amount of 19.0 g in the same manner as in Synthesis Example 25 except that 18.6 g (0.09 mol) of the bromoester obtained in Referential Example 1 were used in place of the bromoester obtained in Referential Example 8.

Synthesis Example 29

Synthesis of O,O'-bis(1-methyl-2-butenyloxycarbonylmethyl)bisphenol A

O,O'-Bis(1-methyl-2-butenyloxycarbonylmethyl) bisphenol A [the formula (44)] was obtained in an amount of 18.9 g in the same manner as in Synthesis Example 25 except that 18.6 g (0.09 mol) of the bromoester obtained in Referential Example 2 were used in place of the bromoester obtained in Referential Example 8.

Synthesis Example 30

Synthesis of O,O'-bis(1,1-dimethyl-2-propenyloxycarbonylmethyl)bisphenol A

O,O'-Bis(1,1-dimethyl-2-propenyloxycarbonylmethyl) bisphenol A [the formula (45)] was obtained in an amount of 18.6 g in the same manner as in Synthesis Example 25 except that 18.6 g (0.09 mol) of the bromoester obtained in Referential Example 3 were used in place of the bromoester obtained in Referential Example 8.

Synthesis Example 31

Synthesis of O,O'-bis(2-cyclohexenyloxycarbonylmethyl)bisphenol A

O,O'-Bis(2-cyclohexenyloxycarbonylmethyl)bisphenol A [the formula (43)] was obtained in an amount of 19.7 g in the same manner as in Synthesis Example 25 except that 19.7 g (0.09 mol) of the bromoester obtained in Referential Example 4 were used in place of the bromoester obtained in Referential Example 8.

Synthesis Example 32

Synthesis of tris(4-(3-methyl-2-butenyloxycarbonylmethyloxy)phenyl)methane

Tris(4-(3-methyl-2-butenyloxycarbonylmethyloxy) phenyl)methane [the formula (48)] was obtained in an amount of 14.7 g in the same manner as in Synthesis Example 27 except that 9.7 g (0.033 mol) of tris(4-hydroxyphenyl)methane were used in place of bisphenol A.

Synthesis Example 33

Synthesis of 1,1,2,2-tetrakis(4-(3-methyl-2-butenyloxycarbonylmethyloxy)phenyl)ethane 1,1,2,2-Tetrakis(4-(3-methyl-2-butenyloxycarbonylmethyloxy)phenyl)ethane [the formula (52)] was obtained in an amount of 14.9 g in the same manner as in Synthesis Example 27 except that 10.0 g (0.025 mol) of 1,1,2,2-tetrakis(4-hydroxyphenyl)ethane were used in place of bisphenol A.

Synthesis Example 34

Synthesis of O,O',O"-tris(3-methyl-2-butenyloxycarbonylmethylated) 2,6-bis(2-hydroxy-5-methylbenzyl)-p-cresol O,O',O"-Tris(3-methyl-2-butenyloxycarbonylmethylated) 2,6-bis(2-hydroxy-5-methylbenzyl)-p-cresol [the formula (55)] was obtained in an amount of 21.9 g in the same manner as in Synthesis Example 27 except that 11.5 g (0.033 mol) of 2,6-bis(2-hydroxy-5-methylbenzyl)-p-cresol were used in place of bisphenol A.

Synthesis Example 35

Synthesis of 3-methyl-2-butenyl 1-adamantanecarboxylate

A flask was charged with 2.6 g (0.03 mol) of 3-methyl-2-buten-1-ol, 3.1 g (0.025 mol) of triethylamine and 20 ml of THF to prepare a solution. While stirring the solution, a solution of 5.0 g (0.025 mol) of 1-adamantanecarbonyl chloride in 40 ml of THF was added dropwise over 1 hour, followed by stirring further for 5 hours. After salts formed were removed by filtration from the reaction mixture, the filtrate was concentrated. The thus-obtained crude product was dissolved in 70 ml of ethyl acetate, and the solution was washed each 3 times with a 5% aqueous solution of sodium hydrogencarbonate and saturated saline and dried over magnesium sulfate. The solvent was then distilled off to obtain 4.9 g of 3-methyl-2-butenyl 1-adamantanecarboxylate [the formula (61)].

Synthesis Example 36

Synthesis O,O'-bis(3-methyl-2-butenyloxycarbonylmethyl)hydroquinone

O,O'-Bis(3-methyl-2-butenyloxycarbonylmethyl) hydroquinone [the formula (65)] was obtained in an amount of 15.9 g in the same manner as in Synthesis Example 27 except that 5.5 g (0.05 mol) of hydroquinone were used in place of bisphenol A.

Examples 20–33

Dissolved in 460 parts of ethyl lactate were 100 parts of 3-methyl-2-butenyloxycarbonylmethylated, 15%-hydrogenated polyhydroxystyrene (Mw=5,640) obtained in accordance with the process of Referential Example 10, 40 parts of each of the specific compounds obtained in Synthesis Examples 23–36, 5 parts of triphenylsulfonium triflate as a photo-induced acid generator and 0.01 part of a fluorine-containing surfactant. The solution was filtered through a polytetrafluoroethylene filter (product of Nihon Millipore Ltd.) having a pore size of 0.1 μm to prepare a resist solution.

After applying the resist solution on a silicon wafer by a spinner, the resist solution was baked for 90 seconds at 90° C., thereby forming a resist film having a thickness of 1.0 μm. The silicon wafer on which the resist film had been formed was exposed by means of an excimer stepper (NA= 0.45) and a test reticle.

Thereafter, the silicon wafer on which the resist solution containing each of the specific compounds of Synthesis Examples 26 and 27 had been coated was baked for 60 seconds at 110° C., while the silicon wafer on which the resist solution containing each of the specific compounds of Synthesis Examples 23–25 and 28–36 had been coated was baked for 60 seconds at 90° C. Each of the thus-baked wafers was then developed by immersion developing in an aqueous solution of tetramethylammonium hydroxide for 1 minute, thereby obtaining a positive pattern.

The sensitivity and resolution of the resist films thus obtained were as shown in Table 4.

TABLE 4

| | | Resin | Specific compound | Sensitivity (*1) | Resolution (*2) |
|---|---|---|---|---|---|
| Example | 20 | a | Bisphenol A bis(3-methyl-2-butenyl) ether Formula (70) | 12 | 0.275 |
| | 21 | a | O,O'-Bis(3-methyl-2-butylated) bis(4-hydroxyphenyl) sulfone Formula (71) | 17 | 0.300 |
| | 22 | a | Hydroquinone bis (3-methyl-2-butenyl) ether Formula (75) | 10 | 0.275 |
| | 23 | a | O,O'-bis(2-butenyloxycarbonylmethyl)bisphenol A Formula (41) | 21 | 0.350 |
| | 24 | a | O,O'-Bis(1-methyl-2-propenyloxycarbonylmethyl)bisphenol A Formula (72) | 15 | 0.325 |
| | 25 | a | O,O'-Bis(3-methyl-2-butenyloxycarbonylmethyl)bisphenol A Formula (40) | 9 | 0.250 |
| | 26 | a | O,O'-Bis(1-methyl-2-butenyloxycarbonylmethyl)bisphenol A Formula (44) | 14 | 0.275 |
| | 27 | a | O,O'-bis(1,1-dimethyl-2-propenyloxycarbonylmethyl)bisphenol A Formula (45) | 7 | 0.275 |
| | 28 | a | O,O'-Bis(2-cyclohexenyloxycarbonylmethyl)bisphenol A Formula (43) | 12 | 0.325 |
| | 29 | a | Tris(4-(3-methyl-2-butenyloxycarbonylmethyloxy)phenyl)methane Formula (48) | 15 | 0.275 |
| | 30 | a | 1,1,2,2-Tetrakis(4-(3-methyl-2-butenyloxy-carbonylmethyloxy)-phenyl)ethane Formula (52) | 17 | 0.300 |
| | 31 | a | O,O',O"-Tris(3-methyl-2-butenyloxycarbonylmethylated) 2,6-bis-(2-hydroxy-5-methylbenzyl)-p-cresol Formula (55) | 24 | 0.275 |
| | 32 | a | 3-Methyl-2-butenyl 1-adamantanecarboxylate Formula (61) | 10 | 0.275 |
| | 33 | a | O,O'-Bis(3-methyl-2-butenyloxycarbonylmethyl)hydroquinone Formula (66) | 11 | 0.250 |

(*1) The unit of the sensitivity is mJ/cm².
(*2) The unit of the resolution is μm.
Kind of resin a: 3-Methyl-2-butenyloxycarbonylmethylated, 15%-hydrogenated polyhydroxystyrene.

Example 34

Dissolved in 460 parts of ethyl lactate were 100 parts of the 4-hydroxystyrene/t-butyl methacrylate copolymer (copolymerization ratio=71:29, Mw=6,410) obtained in Referential Example 11, 40 parts of the specific compound obtained in Synthesis Examples 28, 5 parts of triphenylsulfonium triflate as a photo-induced acid generator and 0.01 part of a fluorine-containing surfactant. The solution was filtered through a polytetrafluoroethylene filter (product of Nihon Millipore Ltd.) having a pore size of 0.1 μm to prepare a resist solution.

After applying the resist solution on a silicon wafer by a spinner, the resist solution was baked for 90 seconds at 90° C., thereby forming a resist film having a thickness of 1.0 g m. The silicon wafer on which the resist film had been formed was exposed by means of an excimer stepper (NA= 0.45) and a test reticle. The silicon wafer was then baked for 60 seconds at 90° C. The thus-baked silicon wafer was then developed by immersion developing in an aqueous solution of tetramethylammonium hydroxide for 1 minute, thereby obtaining a positive pattern.

Example 35

Dissolved in 460 parts of ethyl lactate were 100 parts of a novolak resin (m-cresol/p-cresol=5/5, Mw=4,850), 50 parts of the specific compound obtained in Synthesis Examples 28, 5 parts of triphenylsulfonium triflate as a photo-induced acid generator and 0.01 part of a fluorine-containing surfactant. The solution was filtered through a polytetrafluoroethylene filter (product of Nihon Millipore Ltd.) having a pore size of 0.1 μm to prepare a resist solution.

After applying the resist solution on a silicon wafer by a spinner, the resist solution was baked for 90 seconds at 105° C., thereby forming a resist film having a thickness of 1.0 μm. The silicon wafer on which the resist film had been formed was subjected to electron beam writing by means of an electron beam writing apparatus (acceleration voltage: 50 keV). The silicon wafer was then baked for 60 seconds at 90° C. The thus-baked silicon wafer was then developed by immersion developing in an aqueous solution of tetramethylammonium hydroxide for 1 minute, thereby obtaining a positive pattern.

The sensitivity and resolution of the resist films obtained in Examples 34 and 35 were as shown in Table 5.

TABLE 5

|  |  | Resin | Specific compound | Sensitivity | Resolution (*2) |
|---|---|---|---|---|---|
| Example | 34 | b | O,O'-bis(3-methyl-2-butenyloxy-carbonylmethyl)bisphenol A Formula (40) | 10 mJ/cm² | 0.275 |
|  | 35 | c | O,O'-Bis(3-methyl-2-butenyloxy-carbonylmethyl)bisphenol A Formula (40) | 2.2 mJ/cm² | 0.180 |

(*1) The unit of the resolution is μm.
Kind of resin
a: 3-Methyl-2-butenyloxycarbonylmethylated, 15%-hydrogenated polyhydroxystyrene.
b: 4-Hydroxystyrene/t-butyl methacrylate copolymer (70:29).
c: Novolak resin.

Example 36

The resist composition used in Example 34 was used to obtain a line & space pattern at intervals of 5 μm in the same manner as in Example 34. This pattern was subjected to a UV cure treatment (exposed to light from a low pressure mercury lamp for 1.5 minutes at 90° C. to test it on heat resistance in comparison with an untreated resist pattern. As a result, it was recognized that the form of the untreated pattern was deteriorated at 110° C. or higher. However, no deterioration in form was recognized on the treated pattern even at 160° C. The results are shown in Table 6.

TABLE 6

| Resist composition | UV treatment | Temperature at which pattern form starts to be deteriorated |
|---|---|---|
| 5 μm-Pattern making use of the composition of Example 24 | Conducted Not conducted | 160° C. or higher 110° C. |

As described above, it was found that the compositions according to the present invention can achieve far excellent performance characteristics as resists.

INDUSTRIAL APPLICABILITY

According to the present invention, there can be provided resist compositions which have excellent sensitivity, resolution and heat resistance and can provide excellent pattern form. The resist compositions according to the present invention permit the formation of patterns by exposure to ultraviolet rays, KrF excimer laser beam or the like and are suitable for use as resists for minute processing of semiconductor elements.

We claim:

1. A resist composition comprising a polymer (a) having groups cleavable by an acid, and a compound (b) which can form an acid upon exposure to active rays, wherein the polymer (a) is a polymer having, as the groups cleavable by an acid, groups containing a substituted allyloxy group wherein an unsubstituted allyloxy group is defined as ($CH_2$=CH—$CH_2$—O—) and in the substituted allyloxy group at least two substituents on the allyloxy group carbon atoms are substituents other than hydrogen.

2. The resist composition according to claim 1, wherein in the polymer (a) the substituted allyloxy group is bonded directly or through a divalent organic group to the polymer.

3. The resist composition according to claim 1, wherein the group containing the substituted allyloxy group is represented by the following formula (1):

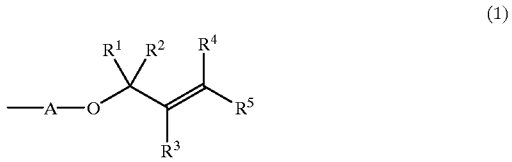

(1)

wherein $R^1$ to $R^5$ are independently selected from the group consisting of a hydrogen atom, halogen atoms, a nitro group, a cyano group, alkyl groups, substituted alkyl groups, alkenyl groups, substituted alkenyl groups, alkadienyl groups, substituted alkadienyl groups, a vinyl group, and a substituted vinyl group, and at least two of $R^1$ to $R^5$ are substituents other than a hydrogen atom, or any of $R^1$ and $R^4$, $R^3$ and $R^5$, or $R^4$ and $R^5$ form a ring, the individual substituents or rings formed therefrom each have at most 12 carbon atoms, and A is a single bond or a divalent organic group.

4. The resist composition according to claim 3, wherein in the formula (1), $R^1$ to $R^5$ are independently a hydrogen atom, a halogen atom, an alkyl group having 1–4 carbon atoms or an alkenyl group having 2–4 carbon atoms.

5. The resist composition according to claim 3, wherein in the formula (1), A is a single bond, a divalent organic group represented by the following formula (4):

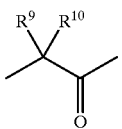
(4)

wherein $R^9$ and $R^{10}$ are independently selected from the group consisting of a hydrogen atom, halogen atoms, alkyl groups, substituted alkyl groups, alkenyl groups, substituted alkenyl groups, a phenyl group, a substituted phenyl group, aralkyl groups, and substituted aralkyl groups, said individual substituents each having at most 10 carbon atoms, or a divalent organic group represented by the following formula (5):

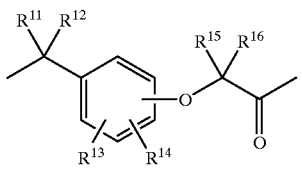
(5)

wherein $R^{11}$ to $R^{16}$ are independently selected from the group consisting of a hydrogen atom, halogen atoms, alkyl groups, substituted alkyl groups, alkenyl groups, and substituted alkenyl groups, said individual substituents each having at most 4 carbon atoms.

6. The resist composition according to claim 1, wherein the polymer (a) having groups cleavable by an acid is such that the substituted allyloxy group is cleaved in the presence of an acid derived from the compound (b) which can form an acid upon exposure to active rays, so that the polymer turns alkali-soluble.

7. The resist composition according to claim 1, wherein the polymer (a) having groups cleavable by an acid comprises a phenol resin in which 1–99% of the phenolic hydroxyl groups are substituted by the group containing the substituted allyloxy group.

8. The resist composition according to claim 7, wherein the polymer (a) having groups cleavable by an acid is a resin having structural units derived from phenol, has the group containing the substituted allyloxy group and is partially hydrogenated.

9. The resist composition according to claim 7, wherein the phenol resin is a polyvinylphenol resin, a partially hydrogenated polyvinylphenol resin, a novolak resin, a partially hydrogenated novolak resin, a copolymer of vinylphenol with monomers other than the vinylphenols, a partially hydrogenated product of a copolymer of vinylphenol with monomers other than the vinylphenols, a copolymer of two or more vinylphenols, or a partially hydrogenated product of a copolymer of two or more vinylphenols.

10. The resist composition according to claim 9, wherein the copolymer of vinylphenol with monomers other than the vinylphenols is a copolymer of vinylphenol with at least one monomer selected from the group consisting of styrenes and (meth)acrylic esters.

11. The resist composition according to claim 1, wherein the polymer (a) having groups cleavable by an acid is a (co)polymer having structural units derived from an aromatic vinyl compound to which the group containing the substituted allyloxy group is bonded.

12. The resist composition according to claim 11, wherein the polymer (a) having groups cleavable by an acid is a copolymer having structural units derived from an aromatic vinyl compound to which the group containing the substituted allyloxy group is bonded, and structural units derived from an unsaturated carboxylic compound.

13. The resist composition according to claim 12, wherein the polymer (a) having groups cleavable by an acid is a copolymer containing structural units represented by the following formula (16), structural units represented by the following formula (17) and structural units represented by the following structural units (18):

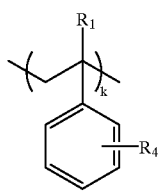
(16)

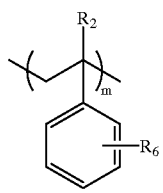
(17)

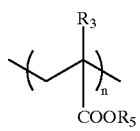
(18)

wherein $R_1$ to $R_3$ are independently selected from the group consisting of a hydrogen atom, alkyl groups of 1–4 carbon atoms, substituted alkyl groups of 1–4 carbon atoms, halogen atoms, a cyano group, and a nitro group, $R_4$ is a group containing a substituted allyloxy group represented by the formula (1):

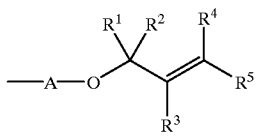
(1)

wherein $R^1$ to $R^5$ are independently selected from the group consisting of a hydrogen atom, halogen atoms, a nitro group, a cyano group, alkyl groups, substituted alkyl groups, alkenyl groups, substituted alkenyl groups, alkadienyl groups, substituted alkadienyl groups, a vinyl group, and a substituted vinyl group, and at least two of $R^1$ to $R^5$ are substituents other than a hydrogen atom, or any of $R^1$ and $R^4$, $R^3$ and $R^5$, or $R^4$ and $R^5$ form a ring, the individual substituents or rings formed therefrom each have at most 12 carbon atoms, and A is a single bond or a divalent organic group, $R_6$ is a hydrogen atom, a hydroxyl group, an alkyl group of 1–4 carbon atoms, a substituted alkyl group of 1–4 carbon atoms, or a halogen atom, $R_5$ is a linear, branched or cyclic alkyl group, a substituted linear, branched or cyclic alkyl group, or a group represented by the following formula (20):

(20)

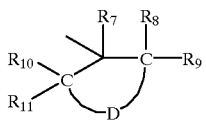

in which $R_7$ is an alkyl group, a substituted alkyl group, an alkenyl group, or a substituted alkenyl group, $R_8$ to $R_{11}$ are independently a hydrogen atom, a halogen atom, an alkyl group, or a substituted alkyl group, at least one of $R_8$ to $R_{11}$ is a hydrogen atom, and D is a divalent organic group, and k, m and n represent proportions of the respective structural units and satisfy the following respective relationships:

0<k<0.95;
0<m<0.95;
0.05≦n≦0.60; and
0.1≦k/(k+m)<1 wherein the sum of the proportions of the respective structural units in the copolymer is 1.

14. The resist composition according to claim 1, wherein the polymer (a) having groups cleavable by an acid is a (co)polymer having structural units derived from an unsaturated carboxylic compound to which the group containing the substituted allyloxy group is bonded.

15. The resist composition according to claim 14, wherein the polymer (a) having groups cleavable by an acid is a copolymer containing structural units derived from an unsaturated carboxylic compound to which the group containing the substituted allyloxy group is bonded, and structural units derived from an aromatic vinyl compound.

16. The resist composition according to claim 15, wherein the polymer (a) having groups cleavable by an acid is a copolymer containing structural units represented by the formula (17)

(17)

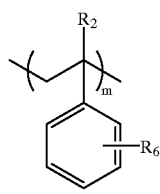

wherein $R_2$ is selected from the group consisting of a hydrogen atom, alkyl groups of 1–4 carbon atoms, substituted alkyl groups of 1–4 carbon atoms, halogen atoms, a cyano group, and a nitro group, and $R_6$ is a hydrogen atom, a hydroxyl group, an alkyl group of 1–4 carbon atoms, a substituted alkyl group of 1–4 carbon atoms, or a halogen atom, and structural units represented by the following formula (19):

(19)

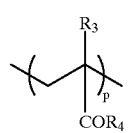

wherein $R_3$ is a hydrogen atom, an alkyl group of 1–4 carbon atoms, a substituted alkyl group of 1–4 carbon atoms, a halogen atom, a cyano group, or a nitro group, $R_4$ is a group containing a substituted allyloxy group represented by the formula (1):

(1)

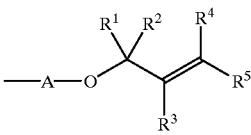

wherein $R^1$ to $R^5$ are independently selected from the group consisting of a hydrogen atom, halogen atoms, a nitro group, a cyano group, alkyl groups, substituted alkyl groups, alkenyl groups, substituted alkenyl groups, alkadienyl groups, substituted alkadienyl groups, a vinyl group, and a substituted vinyl group, and at least two of $R^1$ to $R^5$ are substituents other than a hydrogen atom, or any of $R^1$ and $R^4$, $R^3$ and $R^5$, or $R^4$ and $R^5$ form a ring, the individual substituents or rings formed therefrom each have at most 12 carbon atoms, and A is a single bond or a divalent organic group and m and p in the formulae (17) and (19) represent proportions of the respective structural units and satisfy the following respective relationships:

0.40≦m≦0.95; and
0.05≦p≦0.60 wherein the sum of the proportions of the respective structural units in the copolymer is 1.

17. The resist composition according to claim 1, which comprises the compound (b), which can form an acid upon exposure to active rays, in a proportion of 0.05–50 parts by weight per 100 parts by weight of the polymer (a) having groups cleavable by an acid.

18. The resist composition according to claim 1, which is a mixture further comprising an organic solvent in an amount sufficient to uniformly dissolve the individual components.

19. A resist composition comprising a resin binder (A), a compound (B) which can form an acid upon exposure to active rays, and a compound (C) having a group cleavable by an acid, wherein the compound (C) having the group cleavable by an acid is a compound having a group containing a substituted allyloxy group wherein an unsubstituted allyloxy group is defined as (CH$_2$=CH—CH$_2$—O—) and in the substituted allyloxy group at least one substituent on the allyloxy group carbon atoms are substituents other than hydrogen.

20. The resist composition according to claim 19, wherein in the compound (C) the substituted allyloxy group is bonded directly or through a divalent organic group to a remaining portion of the compound.

21. The resist composition according to claim 19, wherein the group containing the substituted allyloxy group is a group represented by the following formula (1):

(1)

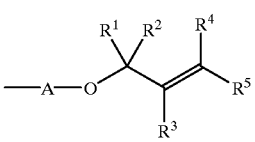

wherein $R^1$ to $R^5$ are independently selected from the group consisting of a hydrogen atom, halogen atoms, a nitro group, a cyano group, alkyl groups, substituted alkyl groups, alkenyl groups, substituted alkenyl groups, a vinyl group, and a substituted vinyl group, at least two of $R^1$ to $R^5$ are substituents other than a hydrogen atom, or any of $R^1$ and $R^4$, $R^3$ and $R^5$, or $R^4$ and $R^5$ form a ring, the individual substituents or rings formed therefrom each have at most 12 carbon atoms, and A is a single bond or a divalent organic group.

22. The resist composition according to claim 19, wherein the group containing the substituted allyloxy group is represented by the following formula (28):

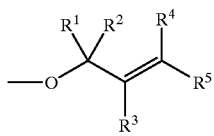

(28)

wherein $R^1$ to $R^5$ are independently selected from the group consisting of a hydrogen atom, halogen atoms, a nitro group, a cyano group, alkyl groups, substituted alkyl groups, alkenyl groups, substituted alkenyl groups, alkadienyl groups, substituted alkadienyl groups, a vinyl group, and a substituted vinyl group, and at least one of $R^1$ to $R^5$ is a substituent other than a hydrogen atom, or $R^1$ and $R^4$, $R^3$ and $R^5$, or any of $R^4$ and $R^5$ form a ring, and the individual substituents or rings formed therefrom each have at most 12 carbon atoms.

23. The resist composition according to claim 19, wherein the resin binder (A) is an alkali-soluble resin.

24. The resist composition according to claim 23, wherein the alkali-soluble resin is a novolak resin, a partially hydrogenated novolak resin, polyhydroxystyrene, partially hydrogenated polyhydroxystyrene, a copolymer of a monomer having a phenolic hydroxyl group with at least one monomer selected from the group consisting of styrenes, (meth)acrylic esters and a mixture containing two or more of these polymers.

25. The resist composition according to claim 19, wherein the resin binder (A) is a resin obtained by modifying an alkali-soluble resin with a group unstable to an acid.

26. The resist composition according to claim 19, wherein in the compound (C) having a group cleavable by an acid, the substituted allyloxy group is bonded directly or through a divalent organic group to an aromatic compound or an organic compound having at least two rings and at least 10 carbon atoms.

27. The resist composition according to claim 19, wherein the substituted allyloxy group is a group free of any non-hydrogen substituent on the allyloxy group carbon atom which is adjacent the allyloxy group oxygen atom or has only non-hydrogen substituents on the allyloxy group carbon atom which is adjacent the allyloxy group oxygen atom.

28. The resist composition according to claim 19, wherein the compound (C) having a group cleavable by an acid is cleaved at its substituted allyloxy group moiety in the presence of an acid derived from the compound (B) which can form an acid upon exposure to active rays, and serves to make the resin binder (A) alkali-soluble or enhance the solubility of the resin binder in alkali.

29. The resist composition according to claim 19, which comprises the components (B) and (C) in proportions of 0.01–60 parts by weight and 2–100 parts by weight, respectively, per 100 parts by weight of the component (A).

30. The resist composition according to claim 19, which is a mixture further comprising an organic solvent in an amount sufficient to uniformly dissolve the individual components.

* * * * *